(12) United States Patent
Tsuchitani et al.

(10) Patent No.: US 7,507,630 B2
(45) Date of Patent: Mar. 24, 2009

(54) METHOD OF FABRICATING A SEMICONDUCTOR DEVICE

(75) Inventors: Masanobu Tsuchitani, Kawasaki (JP); Hitoshi Shinohara, Tokyo (JP); Keiko Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 508 days.

(21) Appl. No.: 11/299,907

(22) Filed: Dec. 13, 2005

(65) Prior Publication Data

US 2006/0160320 A1    Jul. 20, 2006

(30) Foreign Application Priority Data

Jan. 11, 2005    (JP) .............................. 2005-004334

(51) Int. Cl.
  *H01L 21/336* (2006.01)
(52) U.S. Cl. ................. 438/270; 438/589; 257/E21.41; 257/E21.419; 257/E21.384
(58) Field of Classification Search ................. 438/209, 438/212, 259, 268, 270, 589, 725, 780; 257/E21.41, 257/E21.419, E21.384
See application file for complete search history.

(56) References Cited

U.S. PATENT DOCUMENTS

| 5,756,386 | A | * | 5/1998 | Blanchard .................... 438/270 |
| 5,770,514 | A | | 6/1998 | Matsuda et al. |
| 5,877,528 | A | * | 3/1999 | So .............................. 257/341 |
| 5,998,266 | A | * | 12/1999 | So .............................. 438/270 |
| 6,337,270 | B2 | | 1/2002 | Umemoto |
| 6,337,498 | B1 | | 1/2002 | Hasegawa et al. |
| 6,348,712 | B1 | * | 2/2002 | Korec et al. .................. 257/330 |
| 6,429,078 | B2 | * | 8/2002 | Kubo .......................... 438/270 |
| 6,767,826 | B2 | | 7/2004 | Abe |
| 7,081,388 | B2 | * | 7/2006 | Jones ......................... 438/270 |
| 7,271,068 | B2 | * | 9/2007 | Kubo et al. .................. 438/270 |
| 2001/0045598 | A1 | * | 11/2001 | Korec et al. .................. 257/330 |
| 2003/0132480 | A1 | * | 7/2003 | Chau et al. ................... 257/332 |
| 2004/0251491 | A1 | * | 12/2004 | Ma et al. ..................... 257/329 |
| 2005/0189585 | A1 | * | 9/2005 | Jones ......................... 257/330 |
| 2005/0224870 | A1 | * | 10/2005 | Kinzer ....................... 257/330 |
| 2005/0287732 | A1 | * | 12/2005 | Kubo et al. .................. 438/212 |
| 2008/0173938 | A1 | * | 7/2008 | Kubo et al. .................. 257/330 |
| 2008/0191288 | A1 | * | 8/2008 | Kwon et al. ................. 257/383 |

FOREIGN PATENT DOCUMENTS

JP    2006-196545    *    7/2006

* cited by examiner

*Primary Examiner*—M. Wilczewski
(74) *Attorney, Agent, or Firm*—Oblon, Spivak, McClelland, Maier & Neustadt, P.C.

(57) ABSTRACT

A method of fabricating a semiconductor device includes: forming an insulating film on a semiconductor body to cover a termination area surrounding a cell area; forming a mask material film to cover the cell area and the insulating film; forming a resist film to cover the mask material film; patterning the resist film to have an opening serving as a gate-use resist pattern above the cell area and another opening serving as a dummy resist pattern above the insulating film; selectively etching the mask material film by use of the patterned resist film as a mask so that the insulating film is remained under the dummy resist pattern; selectively etching the semiconductor body by use of the patterned mask material film as another mask to form a trench in the cell area as corresponding to the gate-use resist pattern; and burying gate material in the trench to form the trench gate.

6 Claims, 26 Drawing Sheets

METHOD OF FABRICATING A SEMICONDUCTOR DEVICE

CROSS-REFERENCE TO RELATED APPLICATION

This application is based on and claims the benefit of priority from the prior Japanese Patent Application No. 2005-004334, filed on Jan. 11, 2005, the entire contents of which are incorporated herein by reference.

BACKGROUND OF THE INVENTION

1. Field of the Invention

This invention relates to a method of fabricating a semiconductor device such as a trench gate type of power MOSFET (Metal Oxide Semiconductor Field Effect Transistor).

2. Description of the Related Art

Power-use semiconductor devices, in which a power MOSFET is typically known, have a low on-resistance and a high-speed switching possibility, thereby being possible to effectively control a large current with a high frequency. Therefore, the power MOSFET serves as a small power conversion device, for example, as a power device used in personal computers.

A power MOSFET is a semiconductor chip having a semiconductor substrate; an epitaxial growth layer formed thereon; and a plurality of cells formed in the epitaxial layer to be coupled with each other. In a trench gate type power MOSFET, cell gates are buried in a trench and coupled to each other. The trench gate pattern is formed by use of micro-fabrication technologies and size controllability thereof is important.

To form a certain pattern by use of a micro-fabrication technology within semiconductor device fabricating processes, it is desired to improve the size controllability, and this is not limited to the trench gate pattern case. For example, there has been provided a method of forming a contact hole with a certain pattern in an interlayer insulating film with a high uniformity and a high reproducibility (refer to Unexamined Japanese Patent Application Publication No. 2001-351896). There has also been provided a method of forming a trench pattern in an insulating film in such a manner that bottom thereof is set at a certain position (refer to Unexamined Japanese Patent Application Publication No. 2003-324102).

SUMMARY OF THE INVENTION

According to an aspect of the present invention, there is provided a method of fabricating a semiconductor device with a semiconductor body and a trench gate formed in a cell area thereof, including:
forming an insulating film on the semiconductor body to cover a termination area surrounding the cell area;
forming a mask material film to cover the cell area and the insulating film;
forming a resist film to cover the mask material film;
patterning the resist film to have an opening serving as a gate-use resist pattern above the cell area and another opening serving as a dummy resist pattern above the insulating film;
selectively etching the mask material film by use of the patterned resist film as a mask so that the insulating film is remained under the dummy resist pattern;
selectively etching the semiconductor body by use of the patterned mask material film as another mask to form a trench in the cell area as corresponding to the gate-use resist pattern; and
burying gate material in the trench to form the trench gate.

According to another aspect of the present invention, there is provided a method of fabricating a semiconductor device including:
forming an underlying material film on or above a semiconductor body, on or over a first area of which a certain pattern is to be formed, to cover a second area adjacent to the first area;
forming a patterning object film above the first area and the second area, on or above which the underlying material film is formed, of the semiconductor body;
forming a resist film on the patterning object film to cover it;
patterning the resist film to have an opening above the first area, which serves as a certain resist pattern corresponding to the certain pattern, and another opening above the second area, which serves as a dummy resist pattern, in such a manner that the dummy resist pattern surrounds the certain resist pattern or at least two portions thereof are extended in the elongated direction of the certain resist pattern and disposed on the both side of the certain resist pattern;
selectively etching the patterning object film by use of the patterned resist film as a mask to form the certain pattern in such a manner that the underlying material film is remained under the dummy resist pattern.

According to still another aspect of the present invention, there is provided a method of fabricating a semiconductor device including:
forming a patterning object film and an etching resistant material film, the etching rate of which is lower than the patterning object film, on or above a semiconductor body to cover a first area on or over which a certain pattern is to be formed and a second area adjacent to the first area, respectively;
forming a resist film on the patterning object film and the etching resistant material film to cover them;
patterning the resist film to have an opening above the first area, which serves as a certain resist pattern corresponding to the certain pattern, and another opening above the second area, which serves as a dummy resist pattern, in such a manner that the dummy resist pattern surrounds the certain resist pattern or at least two portions thereof are extended in the elongated direction of the certain resist pattern and disposed on the both side of the certain resist pattern;
selectively etching the patterning object film by use of the patterned resist film as a mask to form the certain pattern in such a manner that the etching resistant material film is remained under the dummy resist pattern.

DETAILED DESCRIPTION OF THE EMBODIMENTS

Illustrative embodiments of this invention will be explained with reference to the accompanying drawings below. Note here that the reference symbols used in an embodiment will be used as it is or in a manner of being substantially equal to it in other embodiments explained later, and explanation thereof will be omitted.

First Embodiment

A semiconductor device according a first embodiment is a trench gate type power MOSFET (i.e., U-MOS). The main feature of this embodiment is in that a dummy resist pattern is formed in a semiconductor device process, thereby improving the size controllability of the trench gate pattern.

(Semiconductor Device Structure)

Figure 1:
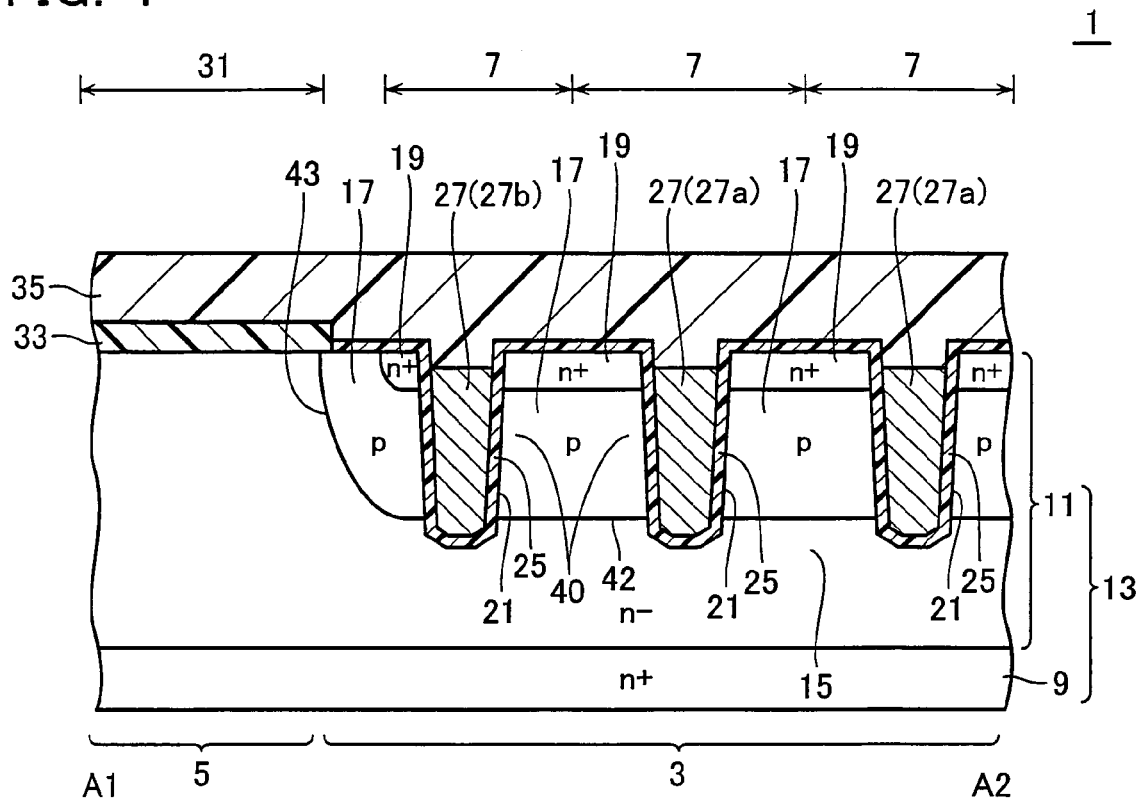
FIG. 1 is a partial sectional view showing the boundary between the cell area and the termination area of a semiconductor device in accordance with a first embodiment.
Figure 2:
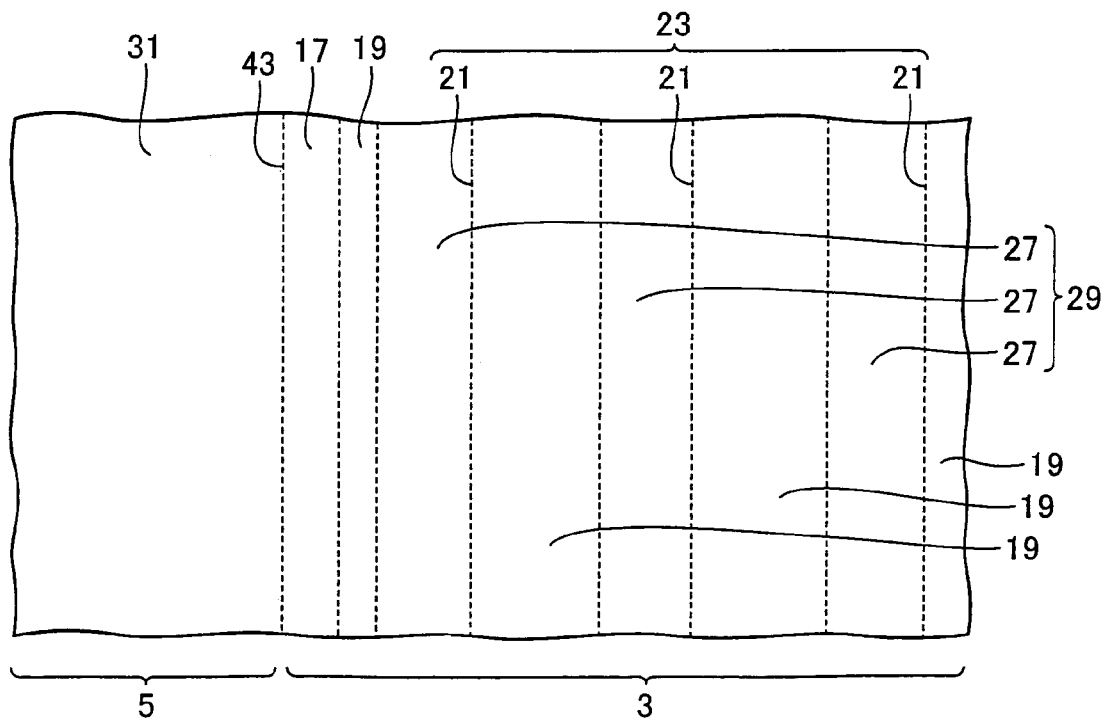
FIG. 2 is a partial plan view thereof.

FIG. 1 is a partial sectional view of a semiconductor device 1 in accordance with the first embodiment, which shows a boundary region of a cell area 3 and a termination area 5 thereof. FIG. 2 shows a partial plan view of the semiconductor device 1 shown in FIG. 1. Note here that source and drain electrodes are omitted from these drawings. In the cell area 3, a plurality of MOSFET cells 7 are formed. Explaining in detail, an $n^-$-type of epitaxial layer 11 is formed on an $n^+$-type silicon substrate 9 serving as a semiconductor substrate, thereby constituting a semiconductor body 13.

The silicon substrate 9 serves as a drain region (i.e., first main electrode region). A p-type base region 17 is formed on the epitaxial layer 11, and an $n^-$-type drift region 15 is defined as being underling the base region 17. An $n^+$-type of source region (i.e., second main electrode region) 19 is formed on the surface of the base region 17.

A plurality of trenches 21 are formed in the semiconductor body 13 as penetrating the source region 19 and base region 17 to reach the drift region 15. These trenches 21 are stripe-shaped in the plan view and serve as elements constituting a trench pattern 23. On the surface of the trenches 21, gate-insulating film 25 is formed of a silicon oxide film, and gates 27 containing polysilicon are buried in the trenches 21. These gates 27 are formed of stripe-shaped patterns and serve as elements constituting a trench gate pattern 29.

On the termination area 5, a termination portion 31 is formed with a certain configuration described later. There is not formed a p-type base region 17 in the termination area 5 of the semiconductor body 13, and the semiconductor body 13 is divided into the cell area 3 and the termination area 5 with the side surface 43 of the base region 17, which defines as a boundary thereof. On the termination area 5 of the epitaxial layer 11, a field insulating film 33 (for example, silicon oxide film) is formed. Note here that if it is in need of increasing the breakdown voltage, a p-type guard ring will be disposed in the termination area 5 of the epitaxial layer 11 as being set in a floating potential. A large number of MOSFET cells 7 formed on the cell area 5 are surrounded by the termination portion 31 with above-described elements. That is, the trench gate pattern 29 is surrounded by the termination portion 31.

An interlayer insulator film 35 is formed on the cell area 3 and termination area 5 to cover the insulating film 33 and gates 27.

Figure 3:
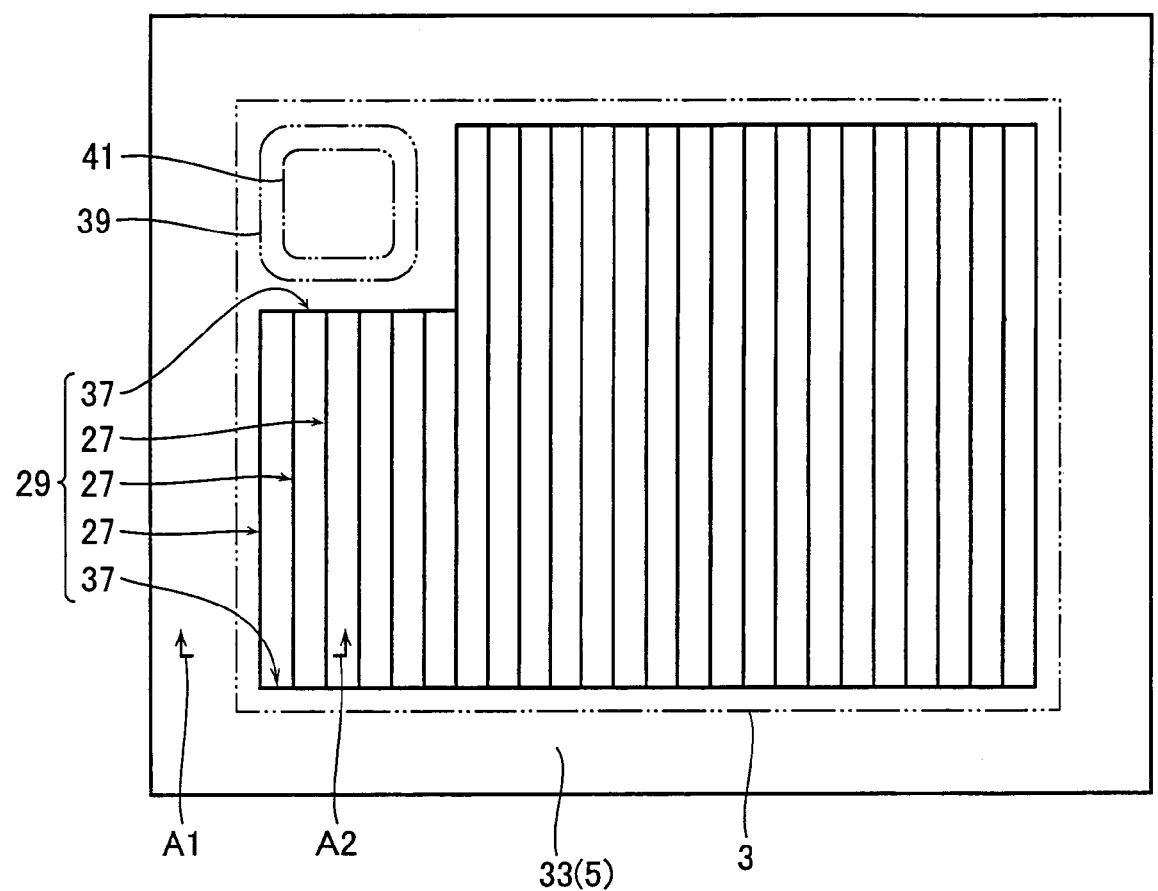
FIG. 3 is a whole plan view of the semiconductor device.

FIG. 3 shows the whole plan view of the semiconductor device 1. The interlayer insulator film is omitted. A1-A2 sectional view in FIG. 3 corresponds to FIG. 1. Adjacent two gates 27 are coupled to each other at the respective both ends with end coupling portions 37. Therefore, the entire gates 27 are coupled to each other. The end coupling portions 27 also are formed in the trench 21 as similar to the gates 27.

The gates 27 and end coupling portions 37 constitute the gate pattern 29. The trench gate pattern 29 is coupled to a gate-use electrode pad 39 with a drawing line (not shown). A metal pad 41 is disposed on the electrode pad 39.

(Operation of the Semiconductor Device)

With reference to FIG. 1, the operation of the semiconductor device 1 will be explained below. In this operation, source region 19 and base region 17 of each MOSFET cell are set in the ground potential; and the substrate 9 serving as the drain region is applied with a certain positive voltage.

To turn on the device 1, a certain positive voltage is applied to the gate 27 of each MOSFET cell 7. With this voltage application, an n-type inversion layer is formed at the channel region 40. Electrons injected from the source 19 flow through this inversion layer to be injected into the drift region 15, and then reach the substrate 9 as the drain region. That is, cell current is carried from the substrate 9 to the source region 19.

To turn off the device 1, the voltage applied to the gate 27 of the MOSFET cell 7 is controlled to be lower than the potential of source region 19. With this voltage control, the n-type inversion layer at the channel region 40 is lost, thereby stopping the electron injection from source region 19 to drift region 15. As a result, current is not carried from the substrate 9 to source region 19. At an off time, the break down voltage of the device 1 will be kept based on a depletion layer extended from p-n junction 42 formed between the drift region 15 and base region 17 into the drift region 15 in the vertical direction.

(Fabrication Process of the Semiconductor Device)

A method of fabricating the semiconductor device 1 in accordance with the first embodiment will be explained below with reference to FIGS. 1, 2 and 4-21. In these drawings, A1-A2 sectional views correspond to FIG. 1; and the others to FIG. 2.

Figure 4:
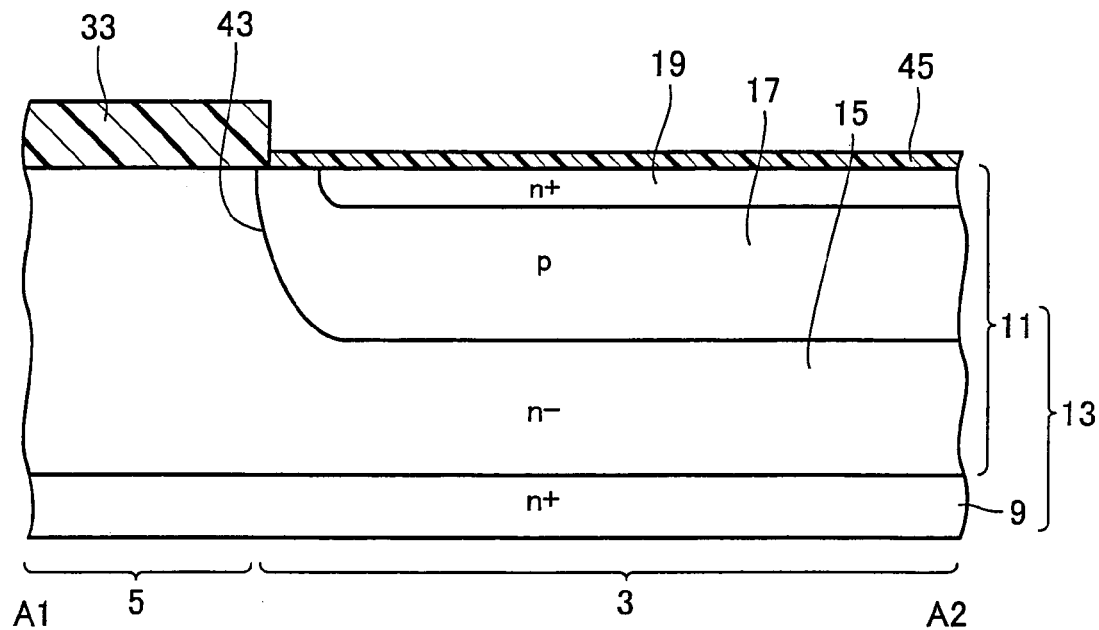
FIG. 4 is a partial sectional view showing a first step in the fabrication method of the semiconductor device in accordance with the first embodiment.
Figure 5:
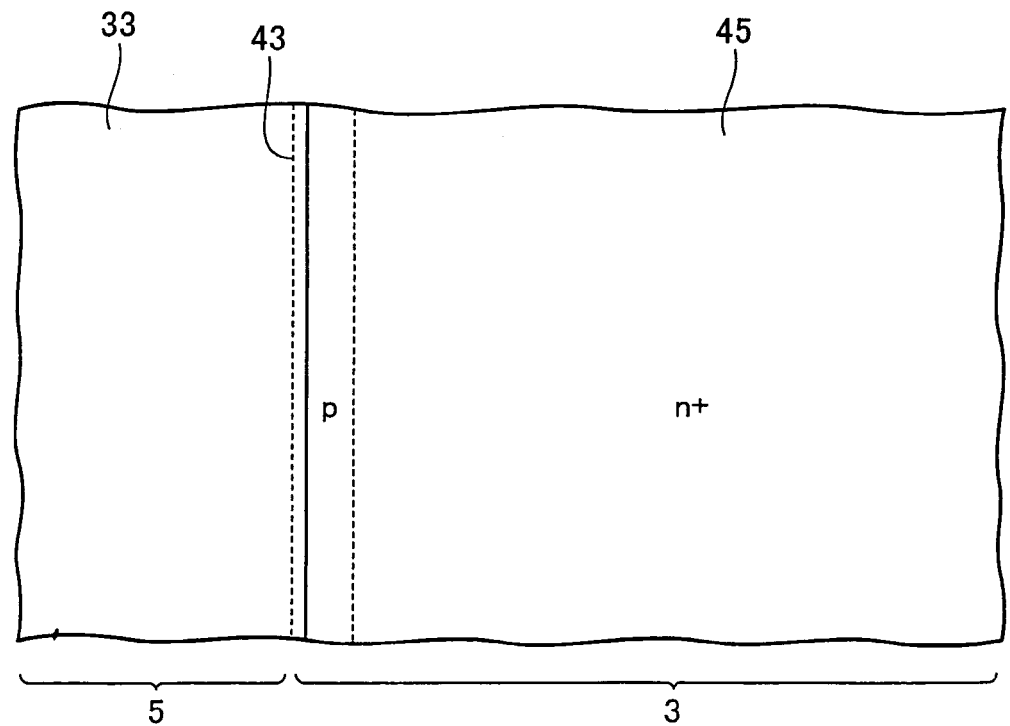
FIG. 5 is a partial plan view thereof.

As shown in FIGS. 4 and 5, there is prepared an $n^+$-type silicon substrate 9, on which an $n^-$-type epitaxial layer 11 is formed. These substrate 9 and epitaxial layer 11 constitute a semiconductor body 13. An insulating film 33 such as a silicon oxide film is formed on the epitaxial layer by thermal oxidization, which is patterned to cover the termination area 5 and expose the cell area 3. The thickness of the insulating film 33 is set at 0.4 to 1.2 μm.

Thereafter, p-type base region 17 and $n^+$-type source region 19 are formed on the cell area 3 of the epitaxial layer 11. At the same time, thermal oxide film 45 is formed on the cell area 3, which is less in thickness than the insulating film 33, for example, 0.03 to 0.1 μm. These may be achieved with well-known processes. The side surface 43 of the base region 17 serves as a boundary between the cell area 3 and the termination area 5.

Figure 6:
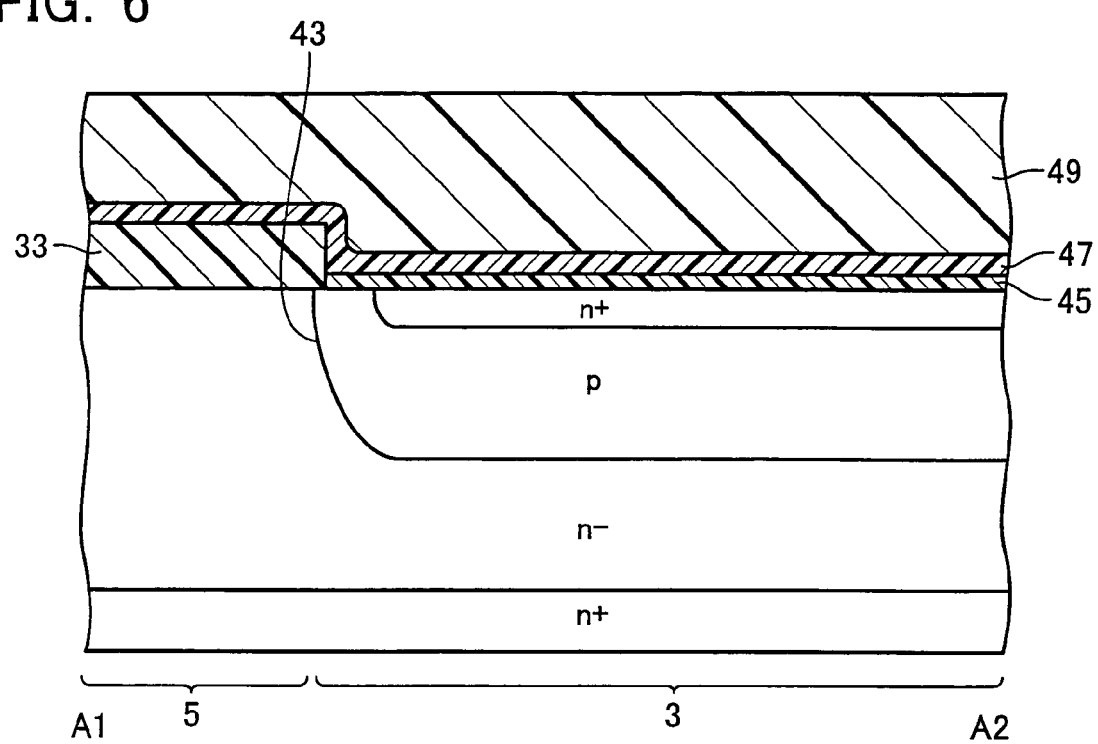
FIG. 6 is a partial sectional view showing a second step in the fabrication method of the semiconductor device in accordance with the first embodiment.
Figure 7:
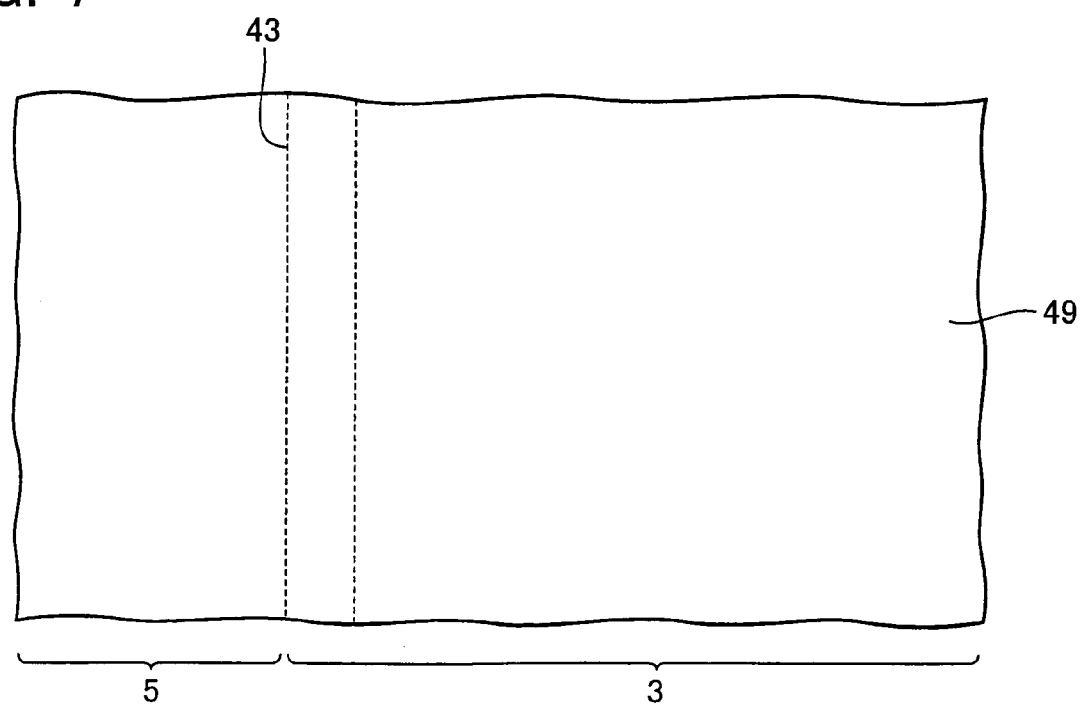
FIG. 7 is a partial plan view thereof.

Next, as shown in FIGS. 6 and 7, mask material film 47 is formed to cover the cell area 3 and the termination area 5, on which the thermal oxide film 45 and the insulating film 33 have been formed, respectively. The mask material film 47 is formed of, for example, CVD (Chemical Vapor Deposition) silicon oxide film of 0.3 to 0.6 μm in thickness. The thermal oxide film 45 serves as a buffer layer for the mask material film 47. Alternatively, the mask material film 47 may be directly formed on the epitaxial layer without forming the thermal oxide film 45. Next, resist film 49 is coated on the mask material film 47 which has been formed to cover the cell area 3 and the termination area 5. The resist film 49 is, for example, 1.2 to 1.5 μm in thickness.

Figure 8:
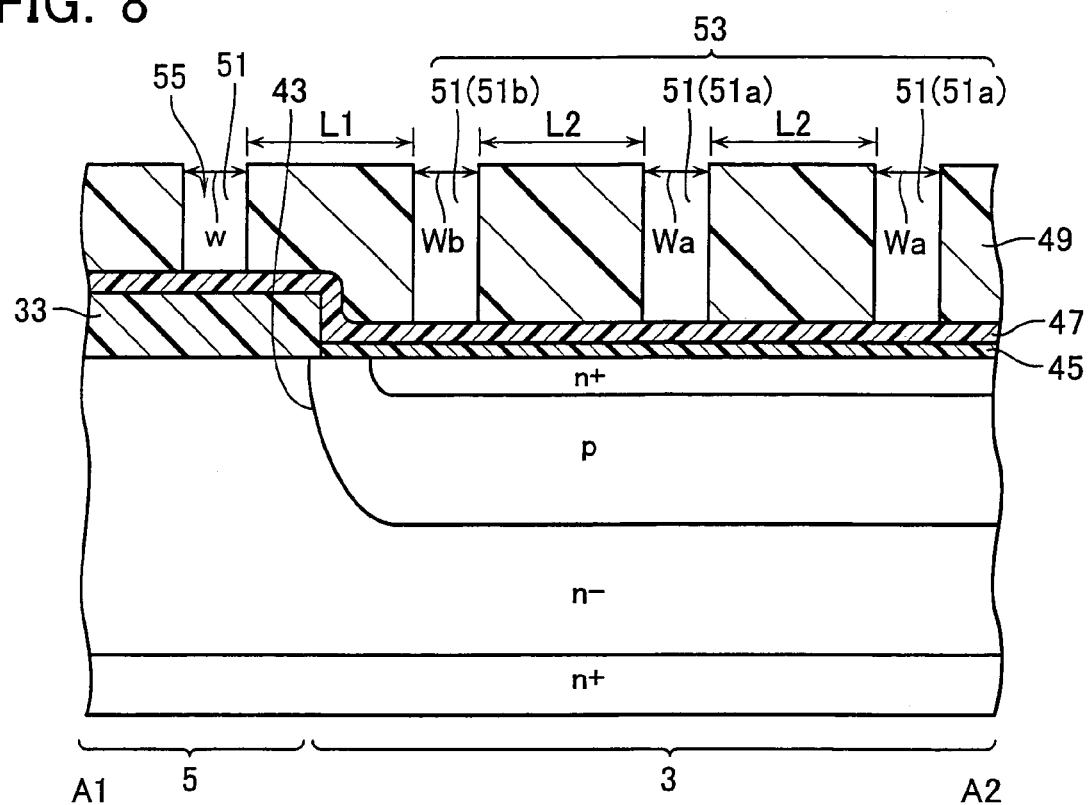
FIG. 8 is a partial sectional view showing a third step in the fabrication method of the semiconductor device in accordance with the first embodiment.
Figure 9:
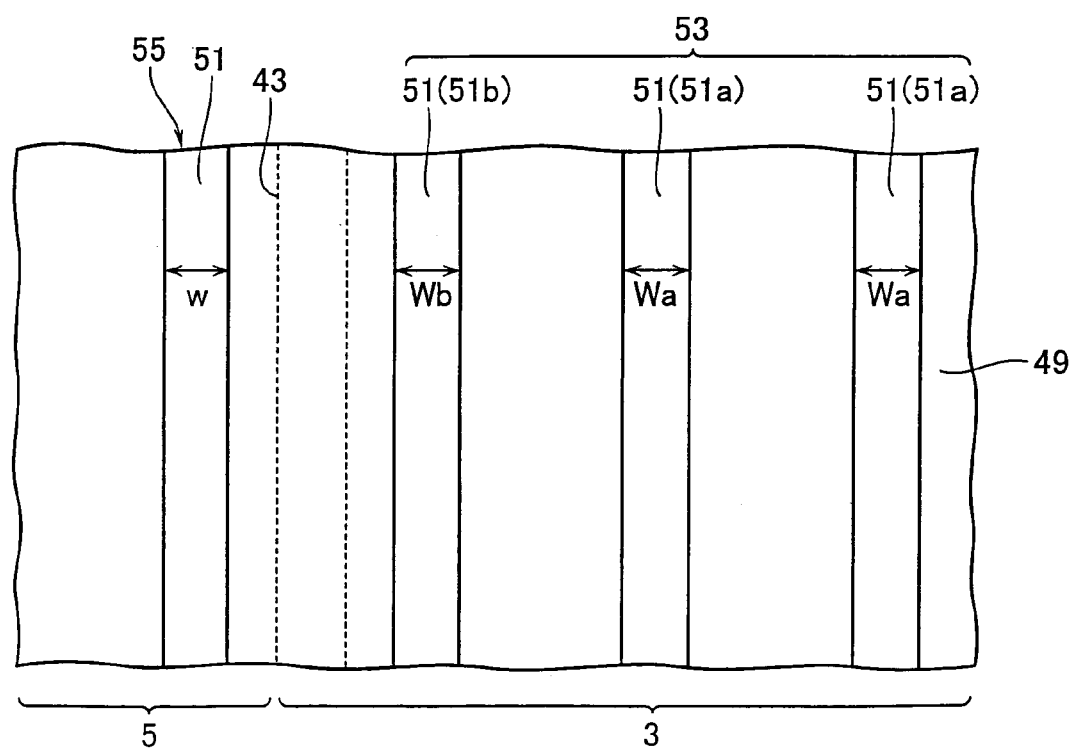
FIG. 9 is a partial plan view thereof.

As shown in FIGS. 8 and 9, the resist film 49 is selectively exposed and developed. Within the resist-removed portions (i.e., openings) 51 where the resist film 49 is removed, openings positioned above the cell area 5 (i.e., resist-removed pattern above the cell area 5) constitute a gate-use resist pattern 53 corresponding to the trench gate pattern 29 shown in FIG. 2. By contrast, the opening 51 above the termination area 3, i.e., resist-removed portion above the insulating film 33, serves as a dummy resist pattern 55.

Figure 22:
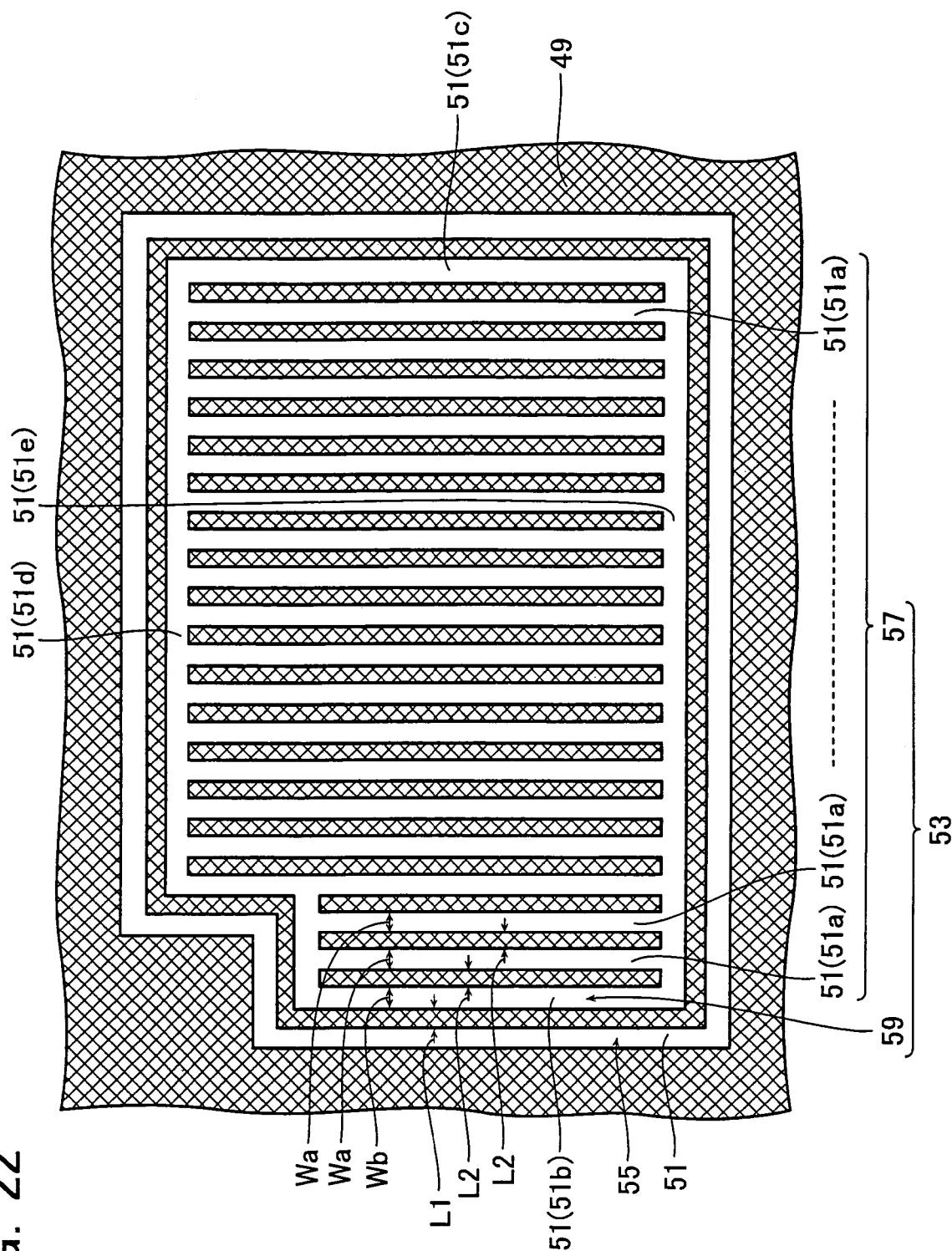
FIG. 22 is a whole plan view of the resist shown in FIG. 9.

FIG. 22 shows a plan view of the whole resist film 49, which has been exposed. Gate-use resist pattern 53 includes a stripe-shaped resist pattern 57 and a frame-shaped resist pattern 59 surrounding it. A plurality of openings 51a constitute the stripe-shaped resist pattern 57 while openings 51b, 51c, 51d and 51e constitute the frame-shaped resist pattern 59. The openings 51a, 51b and 51c correspond to the gates 27 shown in FIG. 3; and openings 51d and 51e to the end coupling portions 37. In practice, these openings 51a to 51e above the cell area 3 are coupled to each other to be united.

Figure 10:
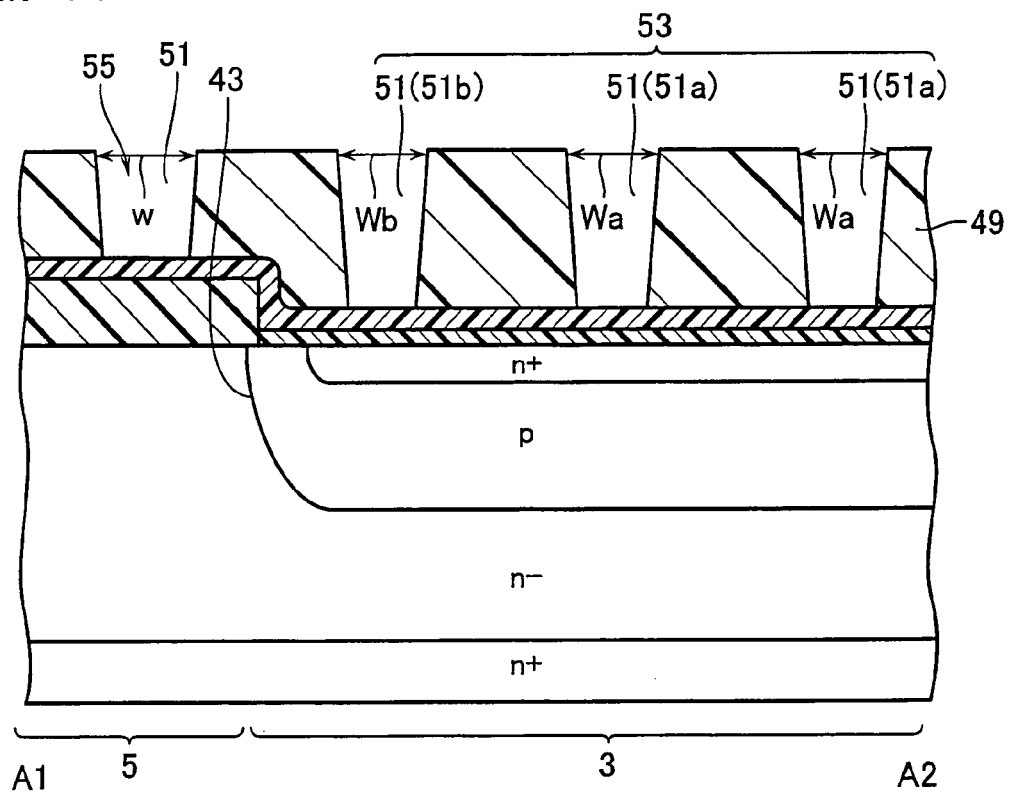
FIG. 10 is a partial sectional view showing a fourth step in the fabrication method of the semiconductor device in accordance with the first embodiment.
Figure 11:
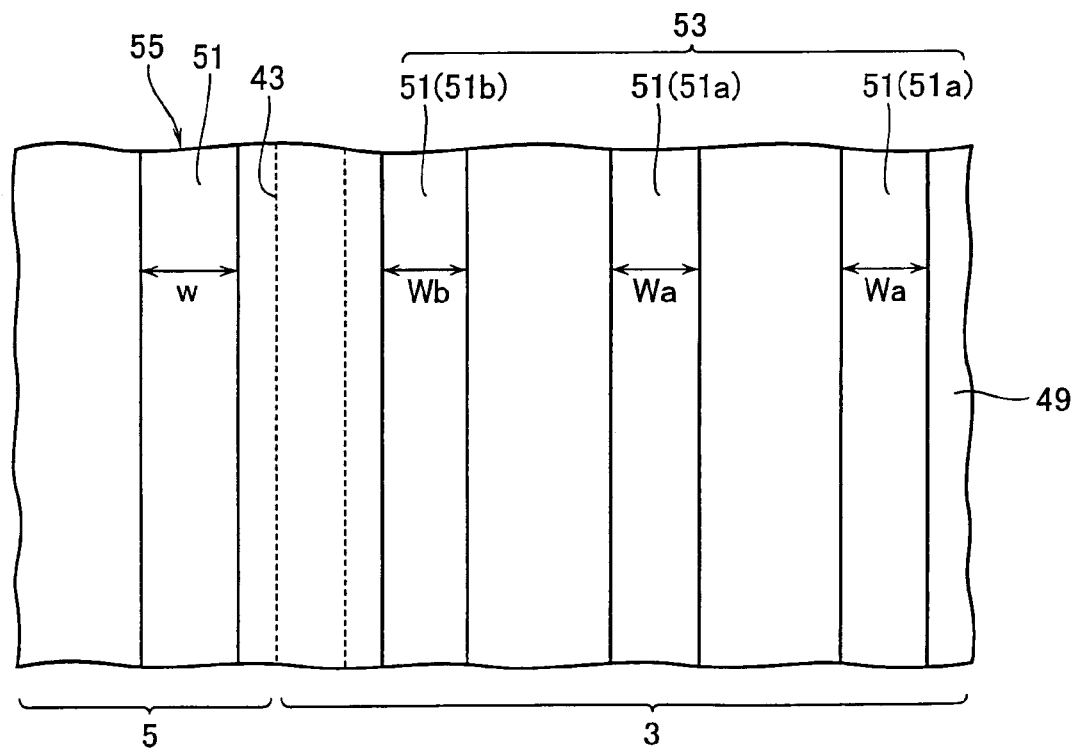
FIG. 11 is a partial plan view thereof.

As shown in FIGS. 10 and 11, the developed resist film 49 is baked to be hardened. The exposure and development of the resist film 49 explained in FIGS. 8 and 9, and the baking explained in FIGS. 10 and 11 constitute a patterning process of the resist film 49.

Figure 12:
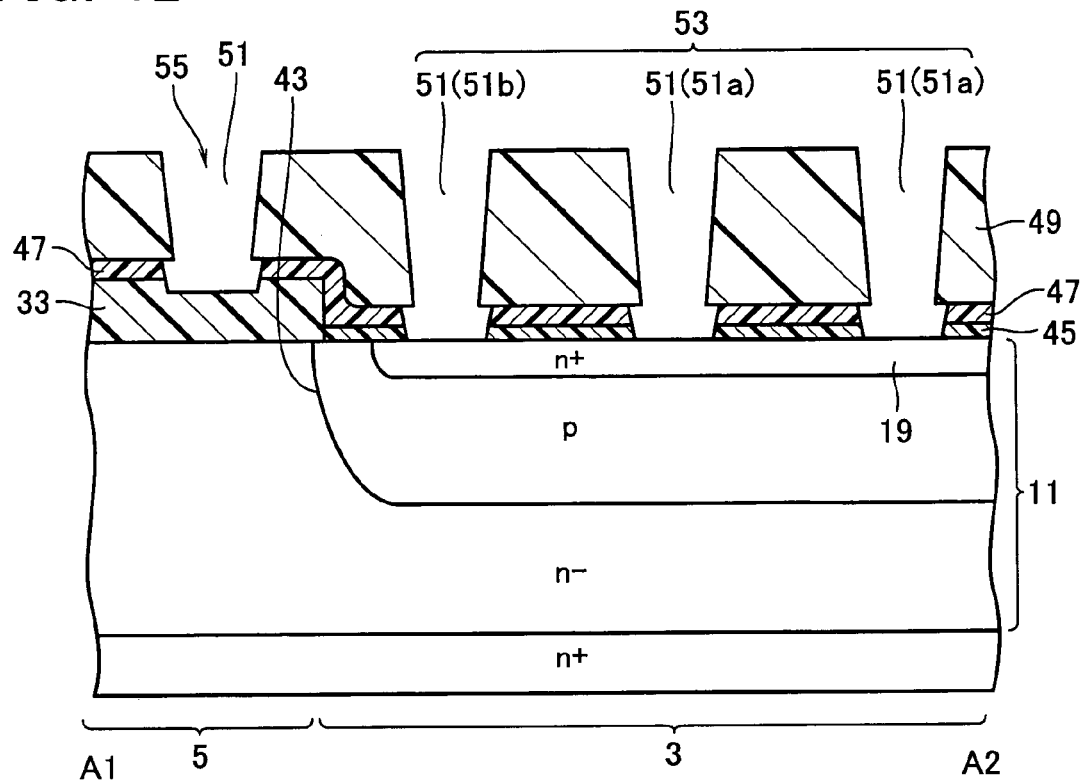
FIG. 12 is a partial sectional view showing a fifth step in the fabrication method of the semiconductor device in accordance with the first embodiment.
Figure 13:
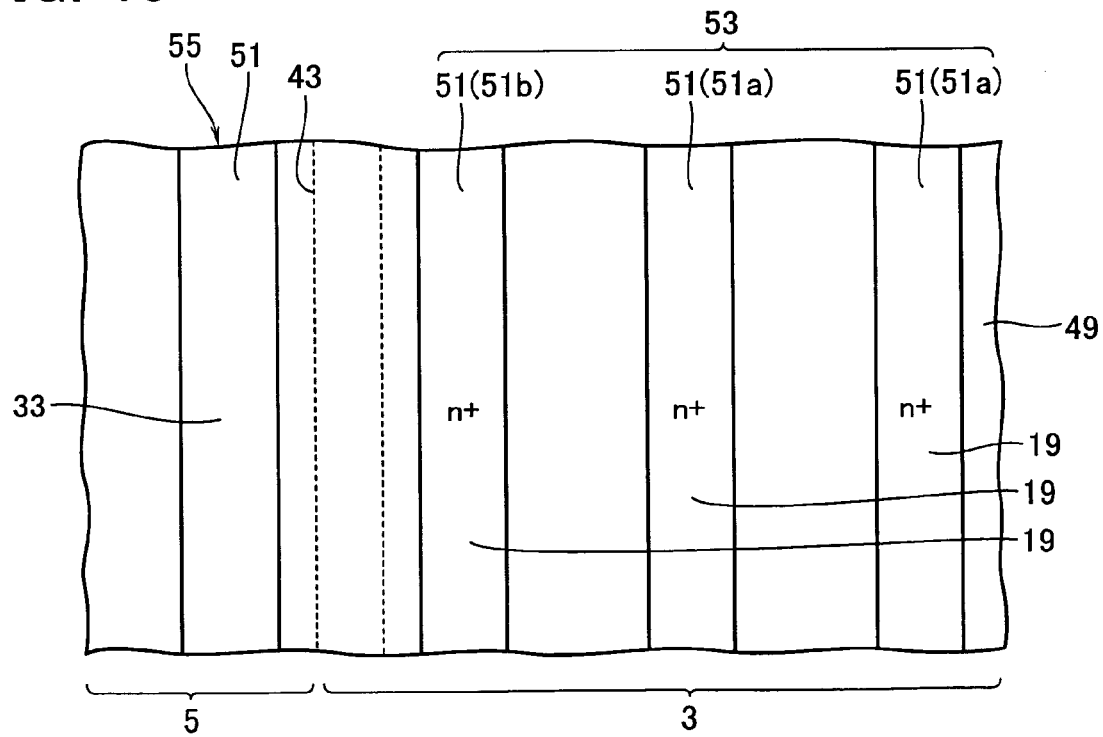
FIG. 13 is a partial plan view thereof.

As shown in FIGS. 12 and 13, the mask material film 47 is selectively etched to be patterned by isotropic etching such as RIE (Reactive Ion Etching) with the patterned resist film 49 used as a mask. As a result, the mask material film 47 is selectively removed at portions corresponding to the gate-use resist pattern 53 above the cell area 3 and the dummy resist pattern 55 above the termination area 5. Note here that the insulating film 33 is remained under the dummy resist pattern 55.

Continue the above-described etching process, and the thermal oxide film 45 on the cell area 3 is removed, so that the source region 19 is selectively exposed. At the etching process of the thermal oxide film 45, the insulating film 33 also is etched on the termination area 3. However, etched is only a part of the top surface of the insulating film 33, because it is thicker than the thermal oxide film 45.

Figure 14:
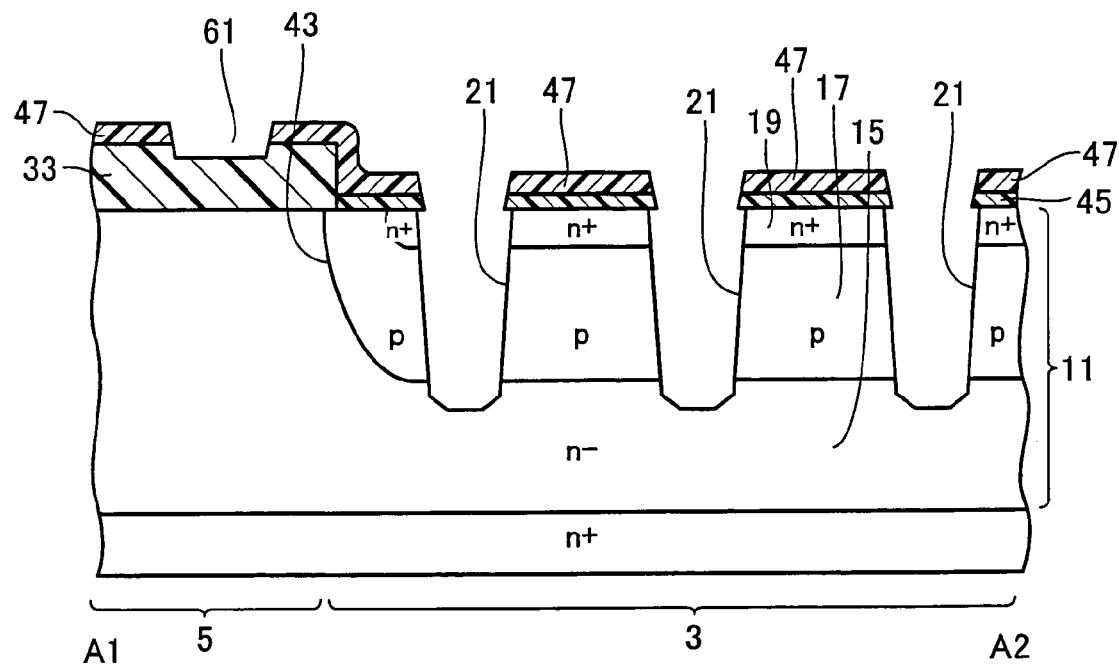
FIG. 14 is a partial sectional view showing a sixth step in the fabrication method of the semiconductor device in accordance with the first embodiment.
Figure 15:
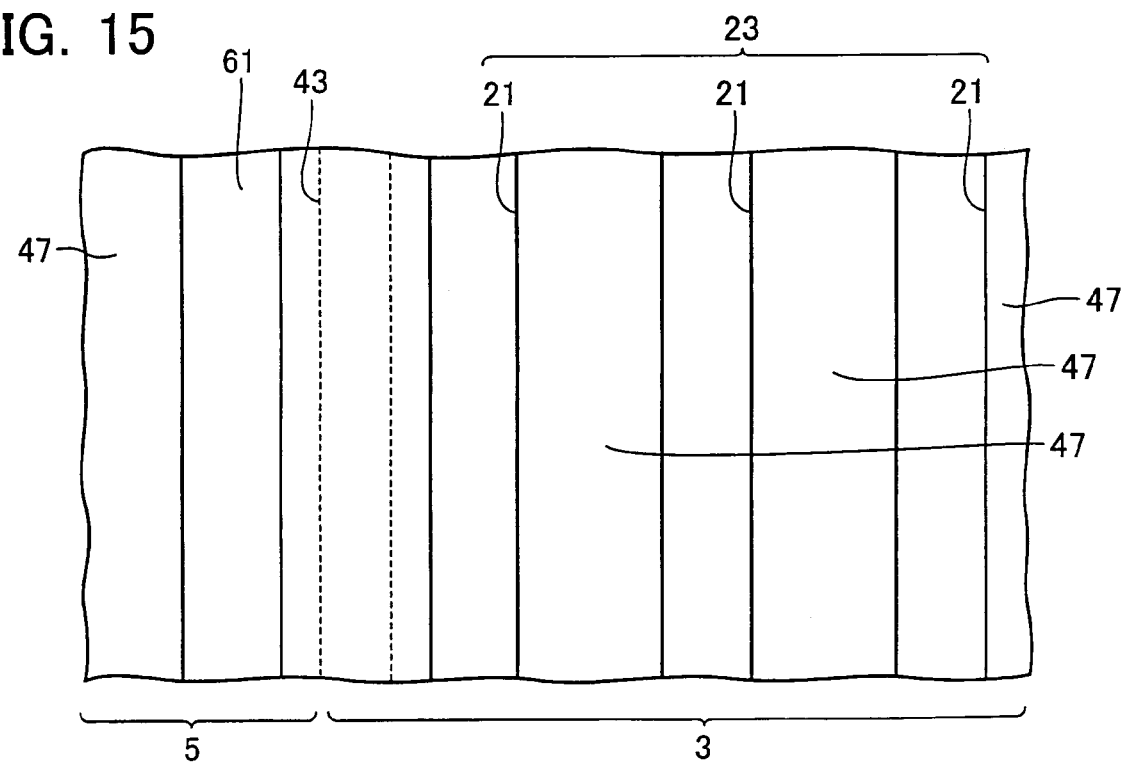
FIG. 15 is a partial plan view thereof.

As shown in FIGS. 14 and 15, the resist film 49 is removed. Then, selectively etch the cell area 3 of the epitaxial layer 11 by isotropic etching such as RIE with the patterned mask material film 47 used as a mask, and trench 21 is formed to reach the drift region 15 though the source region 19 and base region 17. Trench pattern 23 (i.e., the pattern of trenches 21) corresponds to the gate-use resist pattern 53 shown in FIG. 22. A trench formed under the frame-shaped resist pattern 59, which is an element of the gate-use resist pattern 53, refers to as a surrounding trench.

There is a portion 61 above the termination area 5, where the mask material film 47 is selectively removed. However, the lo insulating film 33 under the portion 61 has a lower etching rate than the epitaxial layer 11, and is thick. Therefore, no trench is formed in the epitaxial layer 11 in the termination area 5.

Figure 16:
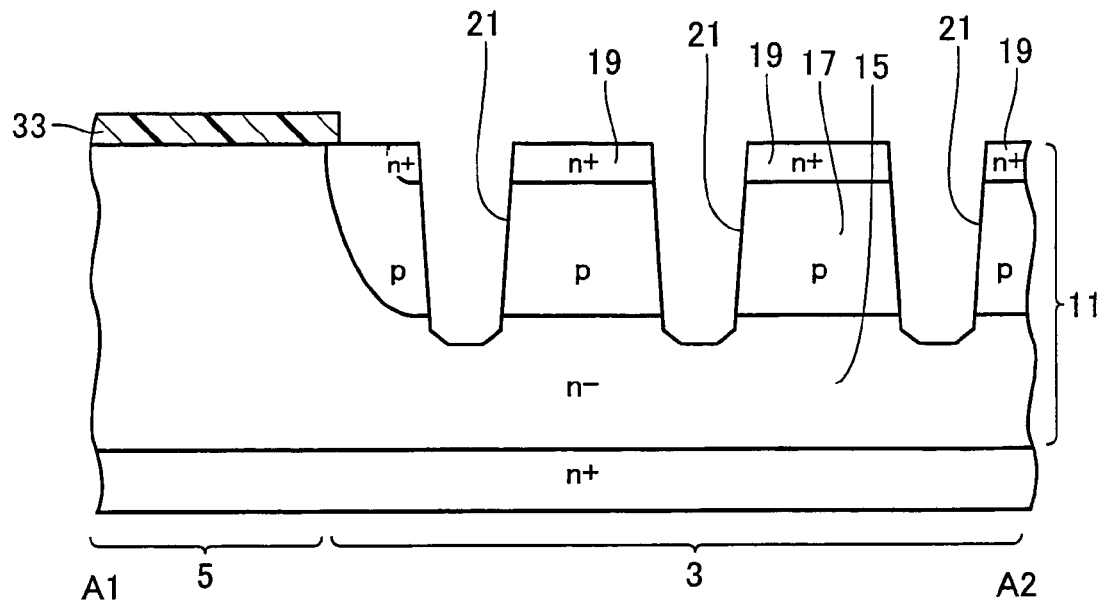
FIG. 16 is a partial sectional view showing a seventh step in the fabrication method of the-semiconductor device in accordance with the first embodiment.
Figure 17:
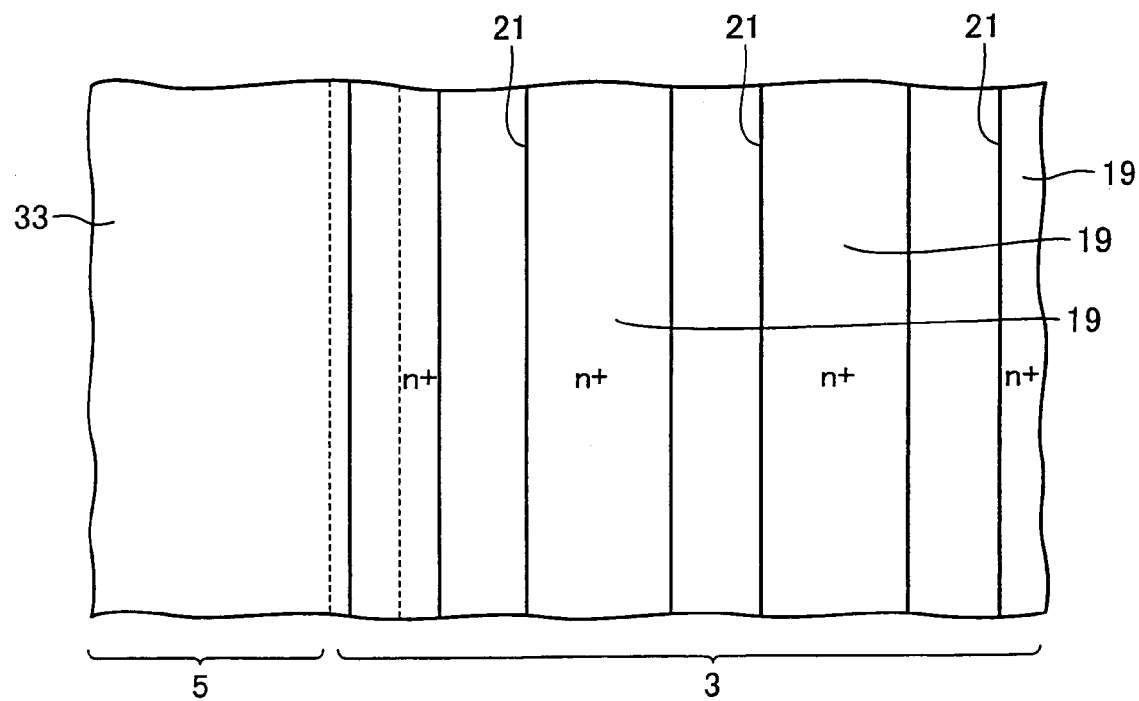
FIG. 17 is a partial plan view thereof.

As shown in FIGS. 16 and 17, the mask material film 47 and the thermal oxide film 45 are removed by ammonium fluoride. At this removing process, the insulating film 33 also is etched, but remained because it is thick.

Figure 18:
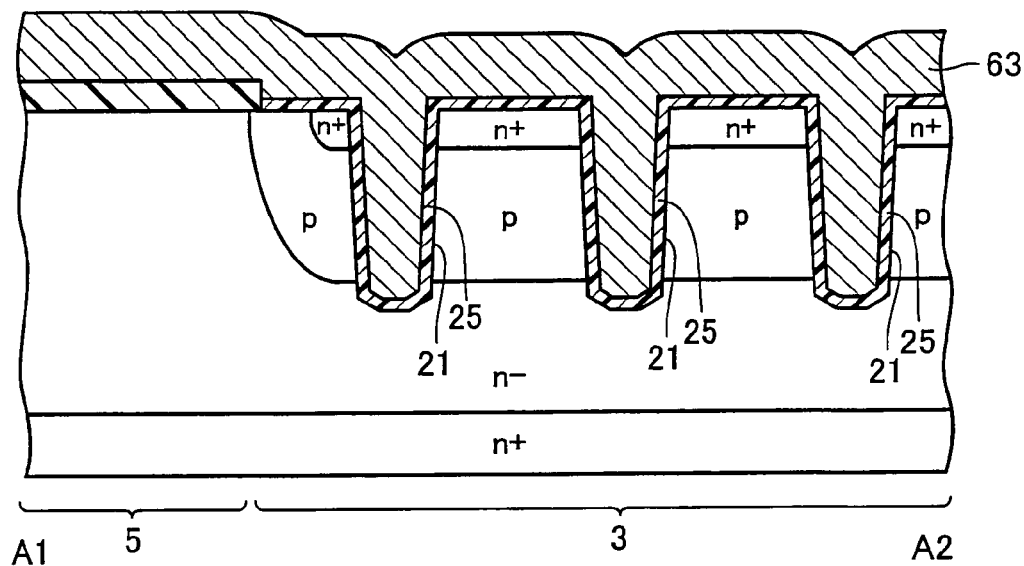
FIG. 18 is a partial sectional view showing an eighth step in the fabrication method of the semiconductor device in accordance with the first embodiment.
Figure 19:
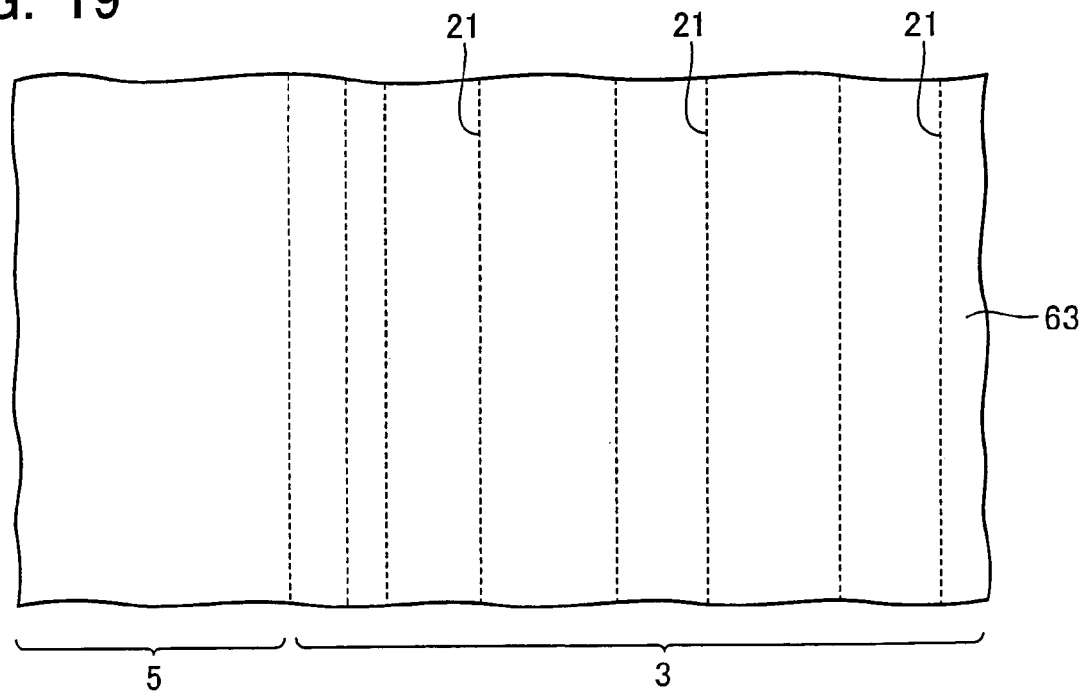
FIG. 19 is a partial plan view thereof.

As shown in FIGS. 18 and 19, gate insulating film 25 is formed on the surface of the trench 21, and then, for example, polysilicon film 63 is deposited on the entire surface by CVD to be buried in the trench 21.

Figure 20:
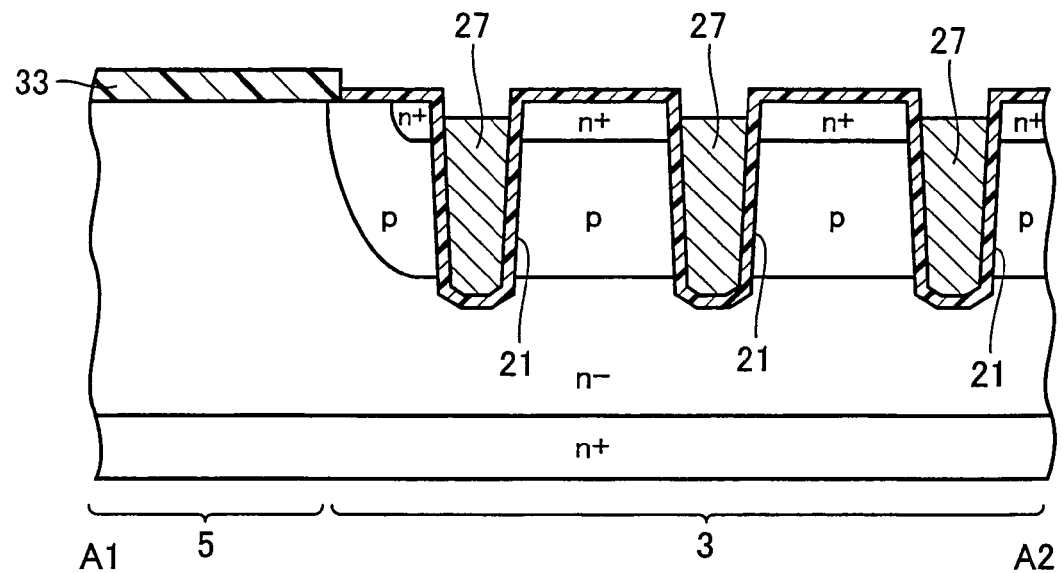
FIG. 20 is a partial sectional view showing a ninth step in the fabrication method of the semiconductor device in accordance with the first embodiment.
Figure 21:
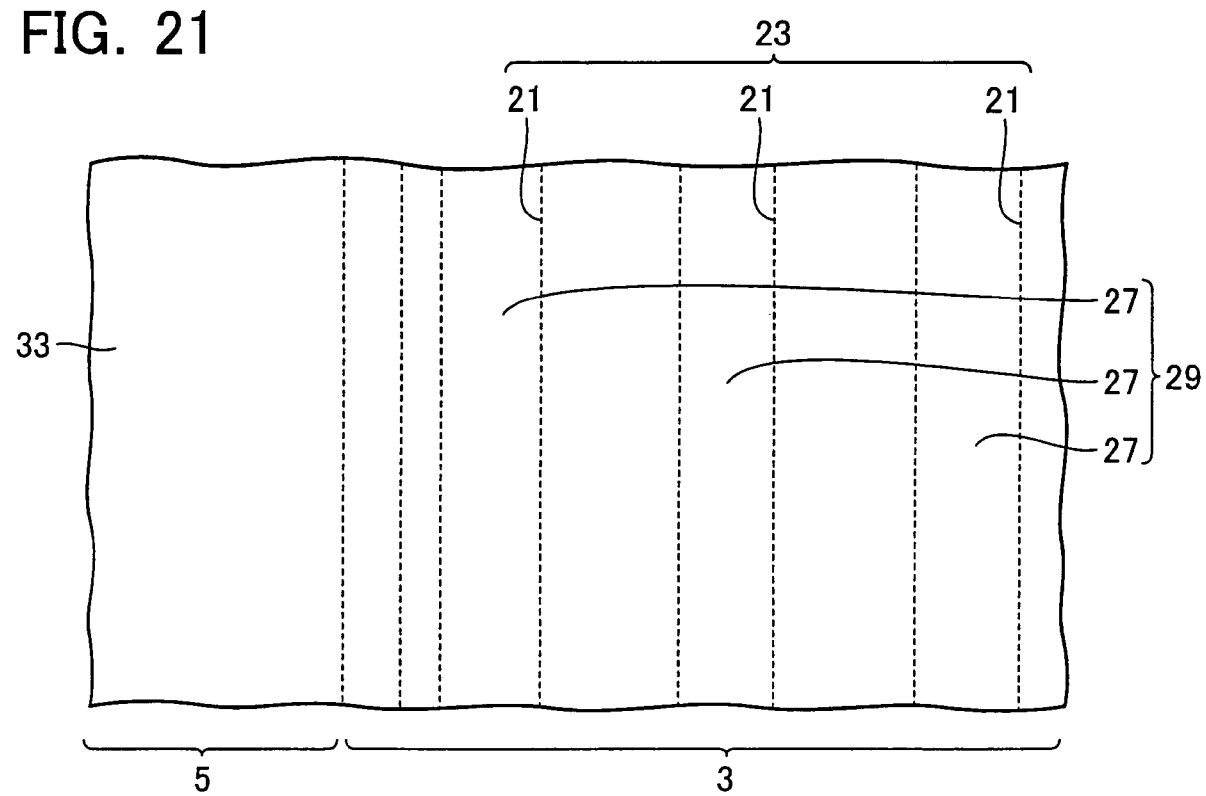
FIG. 21 is a partial plan view thereof.

As shown in FIGS. 20 and 21, the polysilicon film 63 is etched-back by, for example, isotropic etching such as RIE in such a manner that surface thereof reaches the trench 21 while a part of the polysilicon film 63 serving as a drawing line (not shown) is-remained. As a result, the polysilicon film 63 remained in the trench 21 serves as gate 27. That is, gate 27 is buried in the trench 21, whereby the trench gate pattern 29 is formed.

As shown in FIGS. 1 and 2, interlayer insulating film 35 is formed to cover the cell area 3 and the termination area 5. Thereafter, form a source electrode (i.e., the second main electrode) and a drain electrode (i.e., the first main electrode) and the like, which are not shown in these drawings, and the semiconductor device 1 is completed.

(Main Effects of the First Embodiment)

Effect 1:

According to the first embodiment, the dummy resist pattern 55 is formed in the device fabrication processes, so that the trench depths in the trench gate pattern may be uniformed, i.e., the size controllability of the trench gate pattern 29 may be improved.

The reason will be explained in comparison with a comparing example below.

FIGS. 23 to 26 show part of the fabricating processes of a semiconductor device in accordance with the comparing example. In these drawings, FIGS. 23 and 24 correspond to FIGS. 8 and 9, respectively; and FIGS. 25 and 26 to FIGS. 10 and 11, respectively.

In the comparing example, the dummy resist pattern 55 is not formed. Suppose here that width Wa of the opening 51a and width Wb of the opening 51b, which constitute the gate-use resist pattern 53, are, for example, 0.2 µm and 0.2 µm, respectively. The opening 51b is disposed adjacent to the termination area 5, i.e., it is positioned the most outside in the plural openings 51. The others in the opening 51 are openings 51a.

Figure 25:
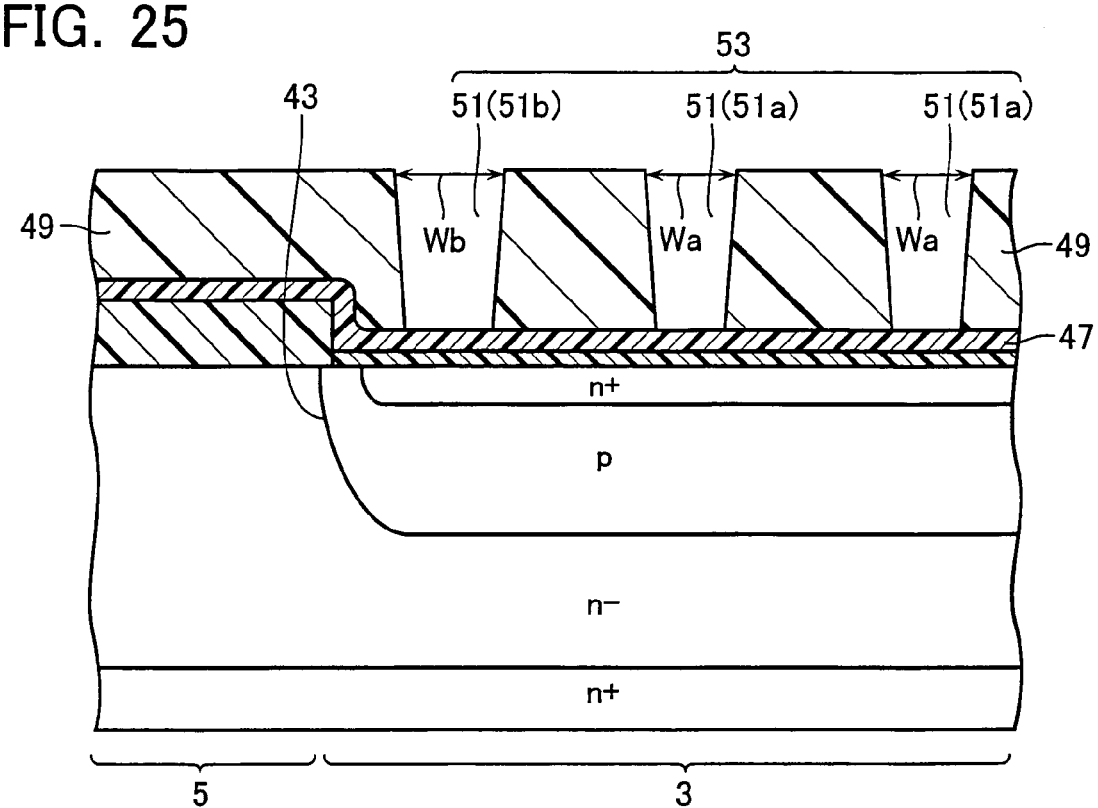
FIG. 25 is a partial sectional view showing a second step in the fabrication method of the semiconductor device in the comparing example.
Figure 26:
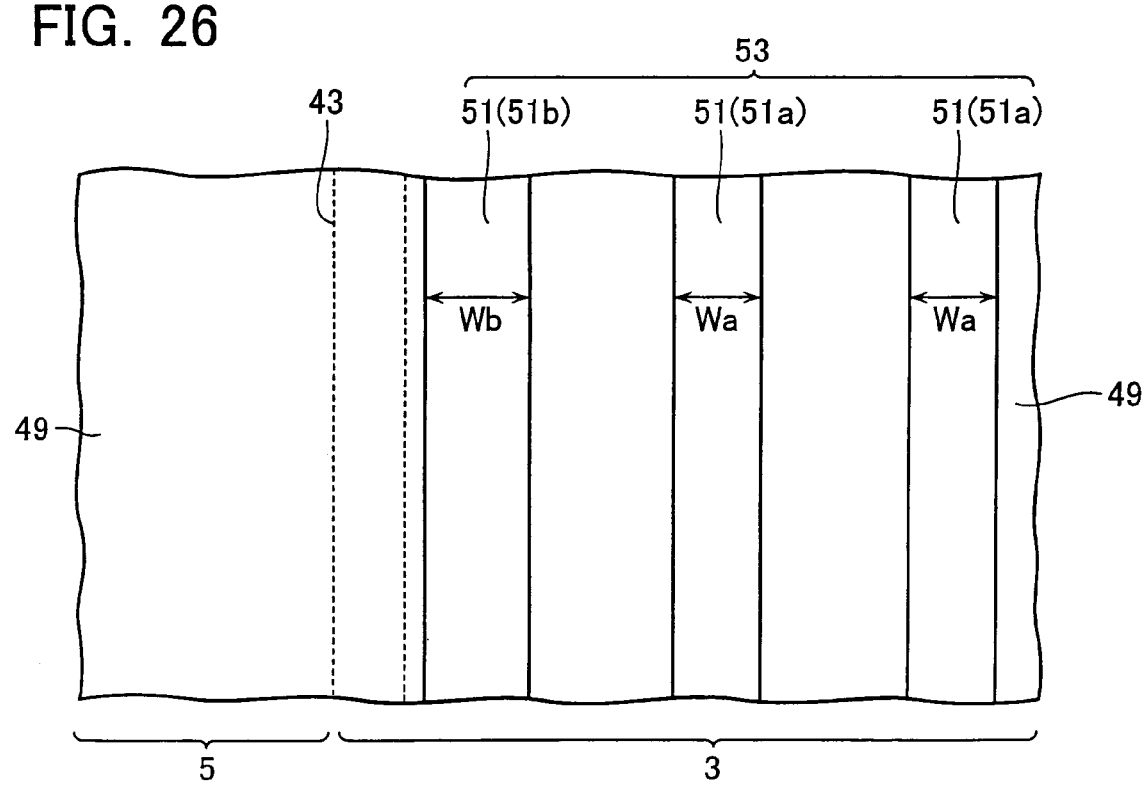
FIG. 26 is a partial plan view thereof.

FIGS. 25 and 26 show a state, in which the resist film 49 is baked and hardened without the dummy resist pattern 55. When baking the resist film 49, it shrinks, so that the widths Wa and Wb of the openings 51a and 51b become large. This is referred to as a so-called twitching phenomenon. The width of the top portions of the openings 51a and 51b is more increased than that of the lower portions. This is because the bottom surface of the resist film 49 is fixed to the mask material film 47 while the top surface thereof is not fixed.

In practice, the widths Wa and Wb of the opening 51a and 51b have been increased to 0.22 µm and 0.37 µm, respectively. This reason will be explained as follows. One side of the opening 51b is the termination area 5, above which there is no opening and the resist film 49 is remained as covering a large area. Therefore, when the resist 49 shrinks, stress generated at the one side of the opening 51b becomes larger, resulting in that the twitching amount of the resist 49 becomes more.

In case the mask material film 47 is patterned with the gate-use resist pattern 53, and then the trench 21 is formed with the mask material film 47, the trench 21 corresponding to the opening 51b becomes deeper than the others. This is due to such a micro loading effect that the larger the mask opening width, the deeper the trench.

Figure 27:
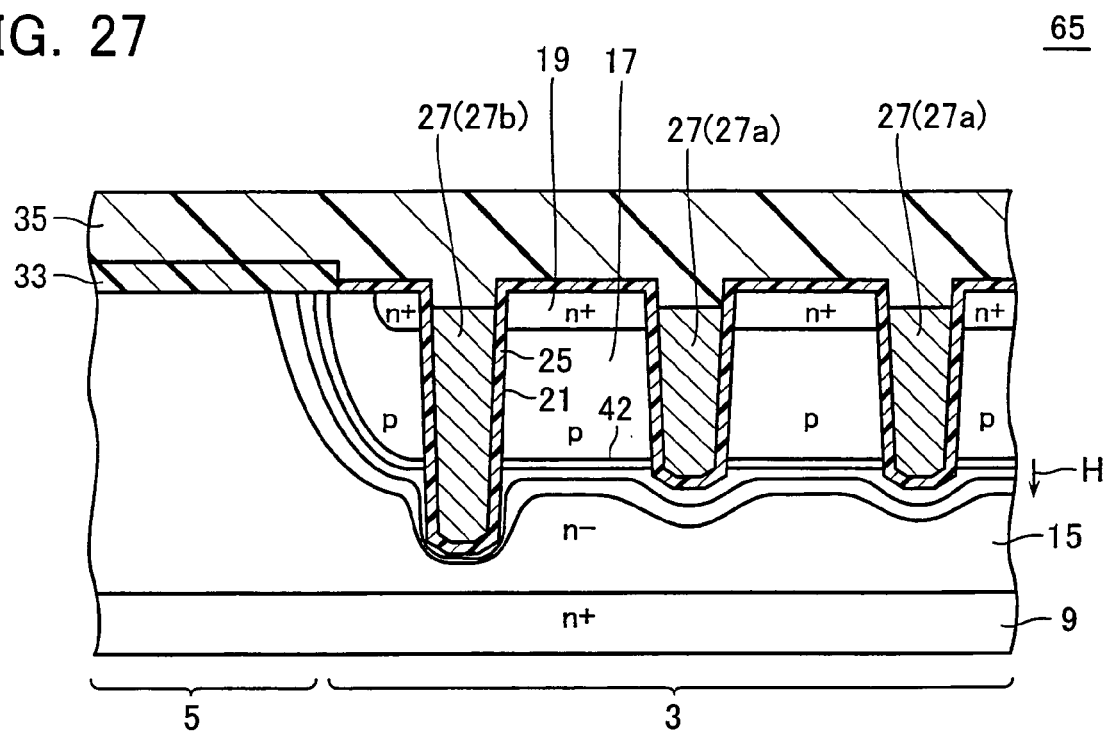
FIG. 27 is a partial sectional view of the semiconductor device.

Therefore, in the semiconductor device 65 fabricated in accordance with the method of the comparing example, as shown in FIG. 27, gate 27b corresponding to the opening 51b becomes deeper in comparison with the others 27a. This leads to the following problem.

As explained in the column of Operation of the Semiconductor Device, the breakdown voltage of the device in an off time is assured by the depletion layer extended into the drift region 15 in the vertical direction from the p-n junction 42. In this depletion layer, as shown by an arrow H, potential becomes higher as the position nears the silicon substrate 9 far from the p-n junction 42. Since the gate 27b has a larger size in depth than the gate 27a, the radius of curvature of the equipotential line becomes smaller at the bottom portion of the gate 27b than the others. As a result, the electric field is concentrated at the bottom portion of the gate 27b, so that the breakdown voltage of the device 65 is reduced.

By contrast, in the semiconductor device 1 fabricated in accordance with the method of the first embodiment shown in FIGS. 1 and 2, the gate 27b disposed adjacent to the termination area 5, i.e., positioned the most outside in the plural gates 27, may be formed to have the same or substantially the same size in depth as other gates 27a. The reason why the trench gate pattern 29 is formed to have a uniform depth in accordance with the first embodiment is as follows.

Figure 23:
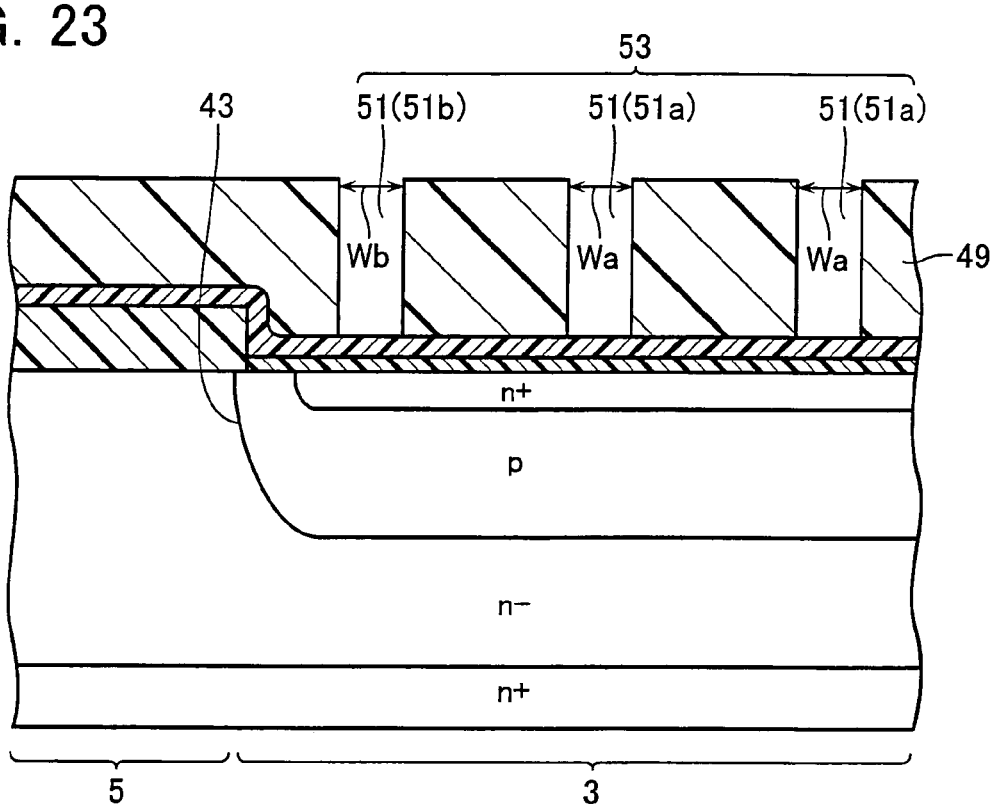
FIG. 23 is a partial sectional view showing a first step in a fabrication method of a semiconductor device in a comparing example.
Figure 24:
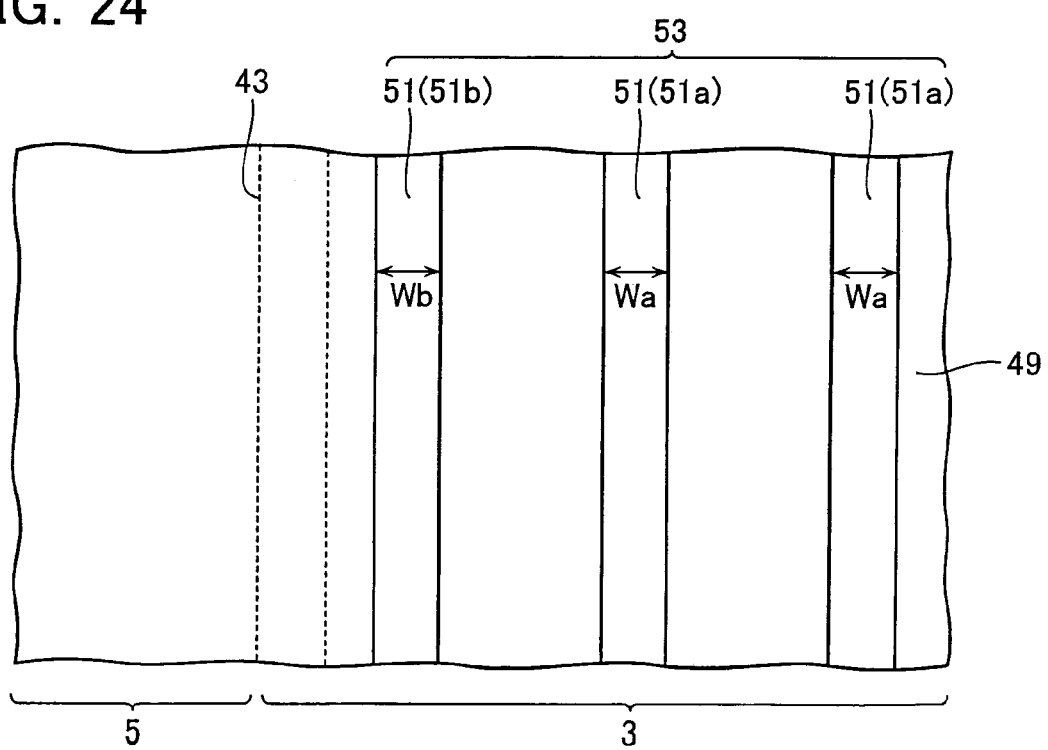
FIG. 24 is a partial plan view thereof.

As shown in FIGS. 8 and 9, suppose that width Wa of the opening 51a and width Wb of the opening 51b, which constitute the gate-use resist pattern 53, are 0.2 µm and 0.2 µm, respectively, as similar to the comparing example shown in FIGS. 23 and 24. It is permitted here that the width W of the opening 51 above the termination area 5 is not equal to the width Wa and Wb because there is no relationship to the degree of the twitching phenomenon. In addition, the distance L1 between the dummy resist pattern 55 and the frame-shaped resist pattern 59 shown in FIG. 22 is designed to be nearly equal as possible to each gap L2 between adjacent two patterns in the stripe-shaped resist pattern 57 and the gap L2 between the stripe-shaped resist pattern 57 and the frame-shaped resist pattern 59.

As shown in FIGS. 10 and 11, the patterned resist 49 is baked to be hardened. At this time, in this embodiment, (1) dummy resist pattern 55 is disposed adjacent to the opening 51b; and (2) the distance L1 between the dummy resist pattern 55 and the frame-shaped resist pattern 59 shown in FIG. 22 is designed to be nearly equal to each gap L2 between adjacent two patterns in the stripe-shaped resist pattern 57 and the gap L2 between the stripe-shaped resist pattern 57 and the frame-shaped resist pattern 59. Due to this, the degree of the twitching phenomenon at the opening 51b becomes substantially the same as that at the opening 51a. Therefore, after having hardened the resist 49, the width Wb of the opening 51b becomes the same as the width Wa of the opening 51a.

The reason why the width W of the opening 51 of the dummy resist pattern 55 is larger than the widths Wa and Wb of the openings 51a and 51b is in that the resist film 49 is remained with a large area adjacent to the dummy resist pattern 55 on the opposite side of the opening 51b.

As described above, the width Wb of the opening 51b after baking the resist film 49 is the same as the width Wa of the opening 51a in the first embodiment. Therefore, with this gate-use resist pattern 53, pattern the mask material film 47 as shown in FIGS. 12 and 13, thereafter form the trench 21 by use of the mask material film as a mask as shown in FIGS. 14 and 15, and the trenches 21 become to have a uniform depth. As a result, the breakdown voltage of the semiconductor device 1 may be improved.

Effect 2:

In the first embodiment, as shown in FIGS. 12 and 13, the mask material film 47 and the thermal oxide film 45 are patterned in such a state that the insulating film (field insulating film) 33 underlies the dummy resist pattern 55. Due to this, in the cell area 3, the epitaxial layer 11 is exposed at the opening 51. By contrast, in the termination area 5, the insulating film 33 is exposed at the opening 51, and the exitaxial layer 11 is not exposed.

Therefore, as shown in FIGS. 14 and 15, when the trench 21 is formed in the epitaxial layer 11 in the cell area 3 with the mask material film 47 as a mask, the insulating film 33 serves as an etching stopper, and it prevents the epitaxial layer 11 in the termination area 5 from being etched to form a trench.

Note here that the insulating film 33, which functions as an etching stopper, is not especially formed as an etching stopper for the dummy resist pattern 55, but formed as an element constituting the termination portion 31. Therefore, according to this embodiment, the epitaxial layer 11 of the termination area 5 may be prevented from being formed a trench without adding other fabrication processes.

(Variations)

In the first embodiment, MOSFET cells 7 have been formed on the cell area 3 to constitute a power device. The present invention is not limited to it. For example, other power semiconductor devices such as an IGBT (Insulated Gate Bipolar Transistor) and the like may be formed on the cell area 3.

Although the-first embodiment has been adapted to a MOSFET, the gate insulating film of which is formed of silicon oxide, the present invention may be adapted to a MISFET (Metal Insulator Semiconductor FET), the gate insulating film of which is formed of other insulator such as a dielectric film with a high permittivity (high-k film).

Although, in the first embodiment, a silicon body has been used for a semiconductor device, other semiconductor materials (for example, silicon carbide, gallium nitride and the like) may be used in the present invention.

Second Embodiment

The above-described first embodiment is a method of improving the size controllability in depth of a trench gate pattern. A second embodiment will be explained below, which is adapted to a case where a certain pattern is formed with a microfabrication technology in semiconductor fabrication processes. FIGS. 28 to 33 show sectional views in order of steps for making a semiconductor device in accordance with this embodiment.

Figure 28:
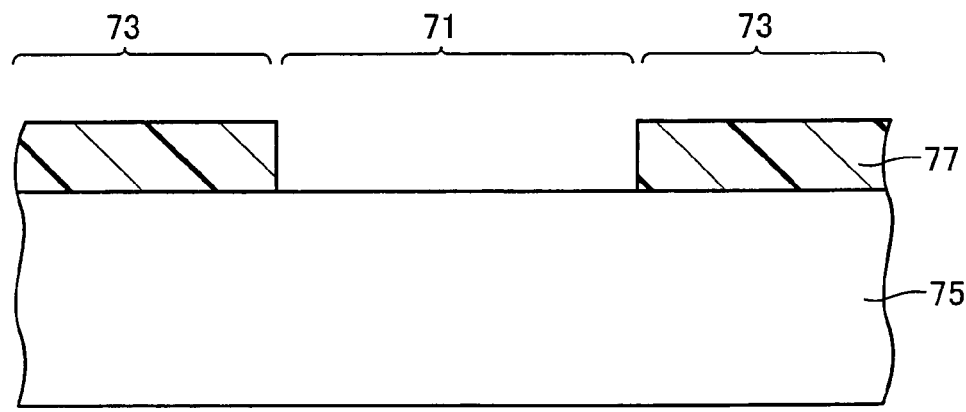
FIG. 28 is a partial sectional view showing a first step in the fabrication method of a semiconductor device in accordance with a second embodiment.

As shown in FIG. 28, a semiconductor body 75 is prepared. A first area 71, on which a certain pattern is to be formed, and a second area 73 adjacent to it are defined. It is permissible to form an insulating layer on the semiconductor body 75.

Formed on the semiconductor body 75 is an underlying material film 77 such as CVD silicon oxide. The underlying material film 77 is patterned so that portion thereof on the first area 71 is removed. As a result, the first area 71 is exposed in such a state that the second area 73 is covered with the underlying material film 77.

Figure 29:
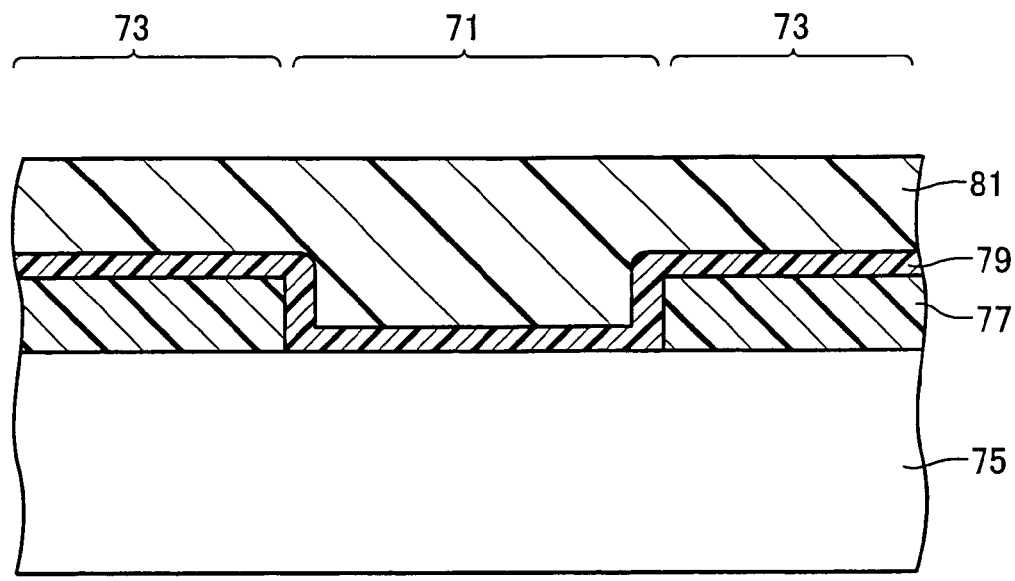
FIG. 29 is a partial sectional view showing a second step thereof.

As shown in FIG. 29, a patterning object film 79 is formed to cover the first area 71 and second area 73 on which the underlying film 77 is formed. The patterning object film 79 is formed of, for example, CVD silicon oxide, i.e., the same material as the underlying material film 77, to be thinner than the underlying film 77. Then, the patterning object film 79 is covered by a resist film 81.

Figure 30:
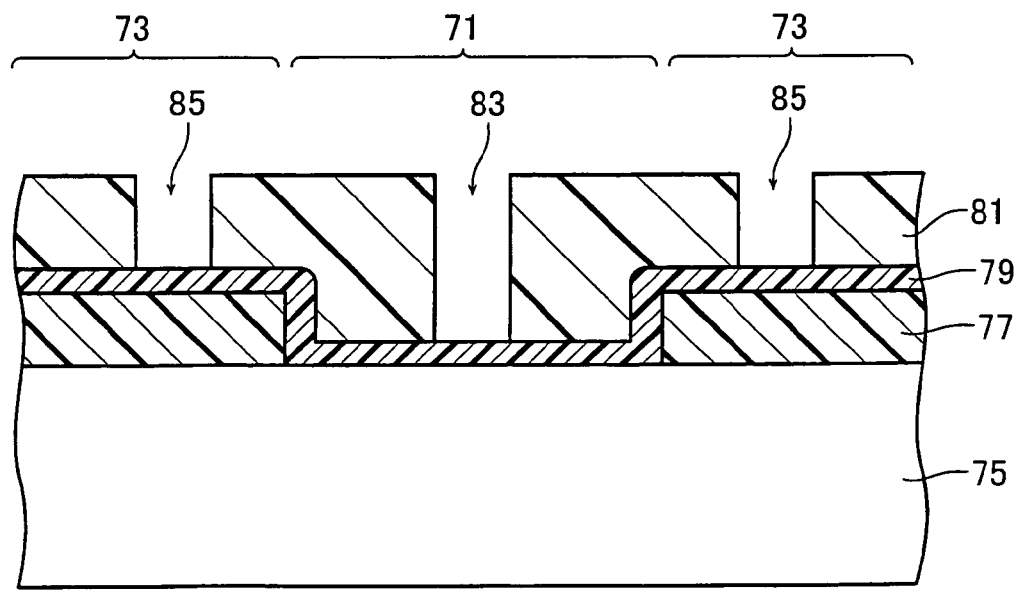
FIG. 30 is a partial sectional view showing a third step thereof.

As shown in FIG. 30, the resist film 81 is selectively exposed and developed. As a result, a resist-removed pattern (i.e., opening) 83 above the first area 71, on which the certain pattern is to be formed, serves as a certain resist pattern corresponding to the certain pattern; and another resist-removed pattern (i.e., opening) 85 above the second area 73, which is covered with the underlying film 77, serves as a dummy resist pattern.

The dummy resist pattern 85 is formed to surround the certain resist pattern 83 or have two stripes disposed outside of the certain resist pattern 83, which extend in the elongated direction of the certain resist pattern 83. This will be explained in detail below.

Figure 34:
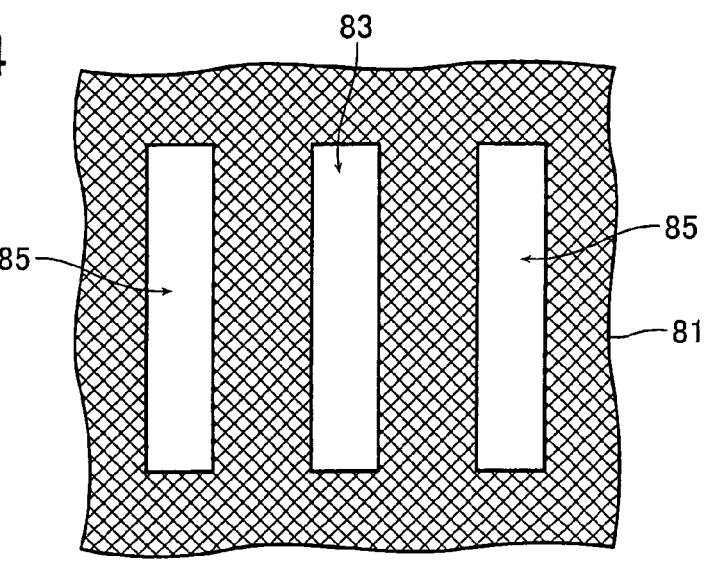
FIG. 34 is a plan view of a dummy resist pattern in accordance with the second embodiment.

FIG. 34 is a plan view of an example of the certain resist pattern 83 and the dummy resist pattern 85. The certain resist pattern 83 is a stripe; and the dummy resist pattern 85 has two stripes, which are extended in the elongated direction of the certain resist pattern 83 and disposed on the both sides of the certain resist pattern 83.

Figure 35:
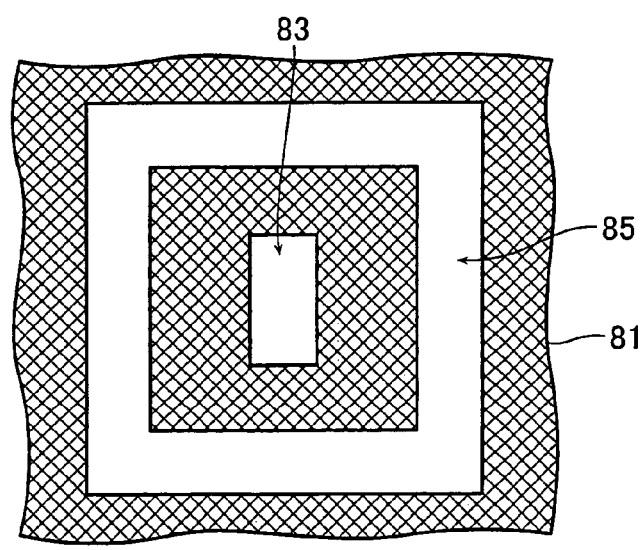
FIG. 35 is a plan view of another example of the dummy resist pattern in accordance with the second embodiment.
Figure 36:
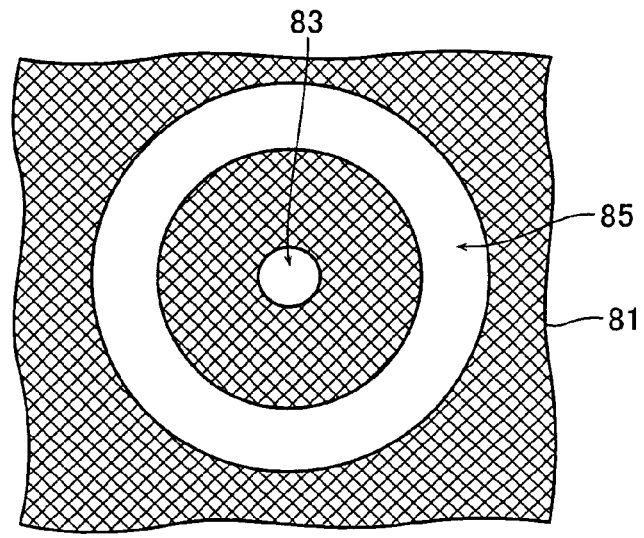
FIG. 36 is a plan view of still another example of the dummy resist pattern in accordance with the second embodiment.

FIG. 35 shows a plan view of another example of the dummy resist pattern 85. The certain resist pattern 83 is surrounded by a square-shaped dummy resist pattern 83. FIG. 36 shows a plan view of still another example of the dummy resist pattern 85. The certain resist pattern 83 is surrounded by a ring-shaped dummy resist pattern 83.

Figure 31:
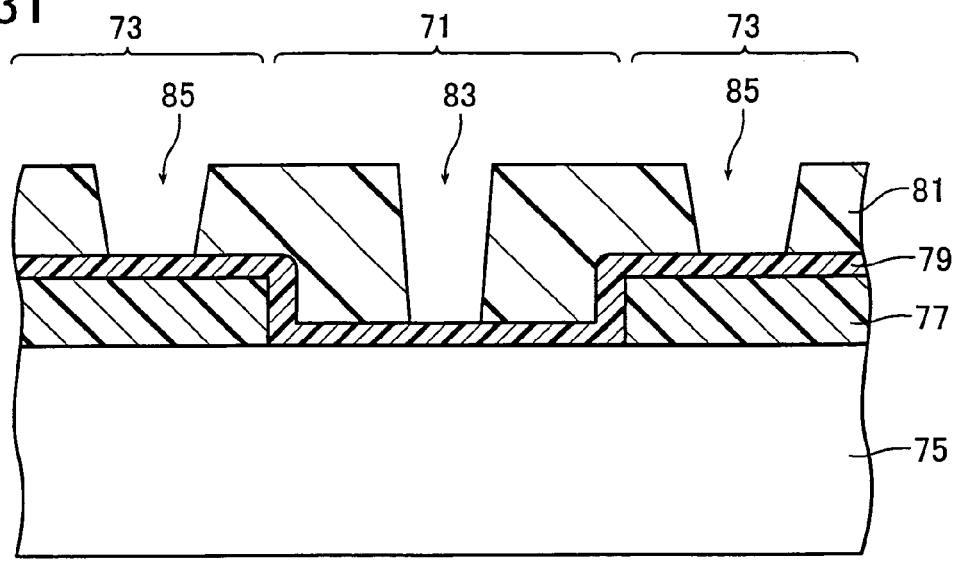
FIG. 31 is a partial sectional view showing a fourth step thereof.

As shown in FIG. 31, the developed resist film 81 is baked to be hardened. Since the dummy resist pattern 85 is disposed on the both side of the certain resist pattern 83, the peripheral resist area around the certain resist pattern 83 is small. Therefore, an affection of the twitching phenomenon to the certain resist pattern 83 may be kept little. In other words, the width of the certain resist pattern 83 after baking increases in little with reference to that before baking as shown in FIG. 30. The exposure and development of the resist film 81 shown in FIG. 30, and baking thereof shown in FIG. 31 constitute a patterning process of the resist film 81.

Figure 32:
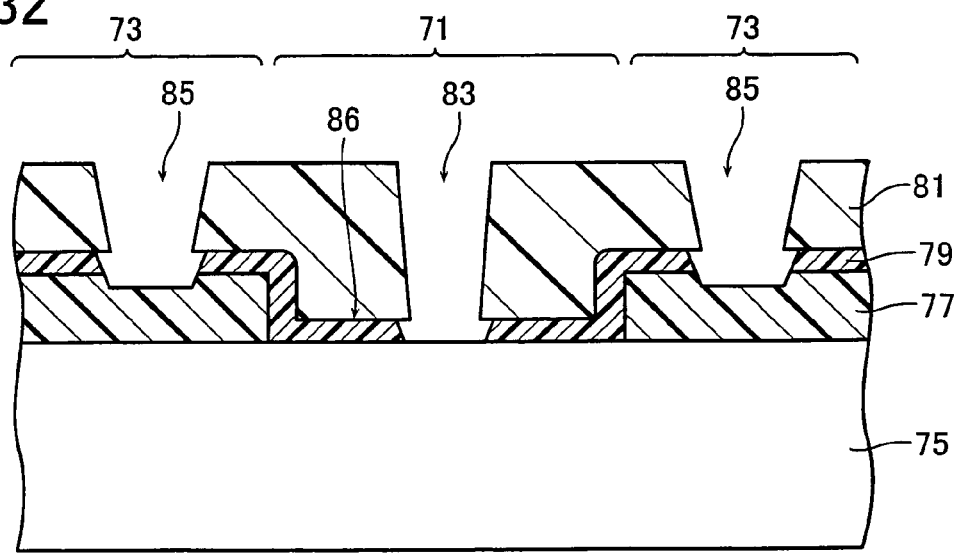
FIG. 32 is a partial sectional view showing a fifth step thereof.

As shown in FIG. 32, selectively etch the patterning object film 79 with the patterned resist film 81 as a mask, and a certain pattern 86 is formed. The semiconductor body 75 is exposed under the certain resist pattern 83, while it is not exposed under the dummy resist pattern 85 because there is underlying material film 77 here. Thereafter, the resist film 81 is removed.

Figure 33:
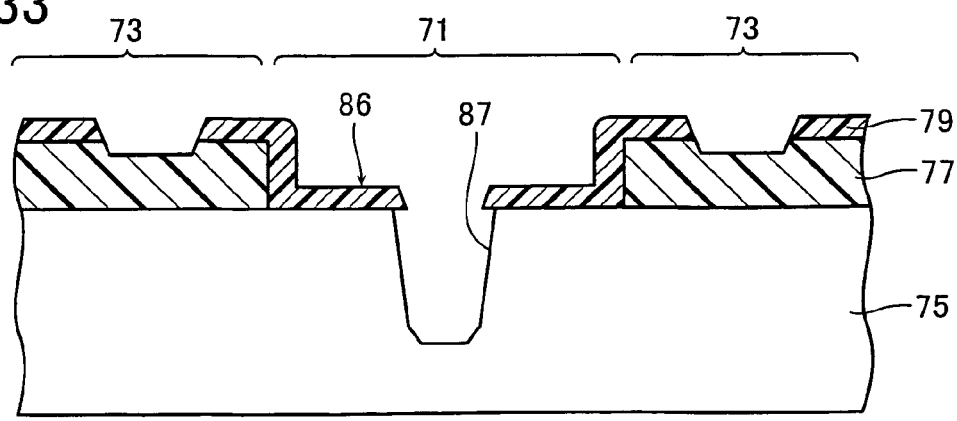
FIG. 33 is a partial sectional view showing a sixth step thereof.

As shown in FIG. 33, the semiconductor body 75 is selectively etched with the certain pattern 86 as a mask. As a result, trench 87 is formed in the first area 71 of the semiconductor body 75. In the second area 73, the underlying material film 77 is disposed under the patterning object film 79, and it serves as an etching stopper, thereby preventing the body 75 from being etched to form a trench here.

According to the method of fabricating a semiconductor device in this second embodiment, as explained in FIG. 31, the width of the certain resist pattern 83 after baking increases in little with reference to that before baking as shown in FIG.

30 because the dummy resist pattern 85 is disposed. Therefore, the size controllability of the trench 87 may be improved.

This embodiment may be adapted to not only a case where a certain pattern is formed in the semiconductor body itself or in a layer formed on the body but also another case where the certain pattern is formed in another layer formed above the body with other layer(s) interposed therebetween.

Third Embodiment

In a third embodiment, a patterning object film and an etching resistant material film, the etching rate of which is lower than the patterning object film, are formed on a semiconductor body 75 to cover a first area on which a certain pattern is to be formed and a second area adjacent to the first area, respectively. FIGS. 37 to 42 show sectional views in order of steps for making a semiconductor device in accordance with this embodiment.

Figure 37:
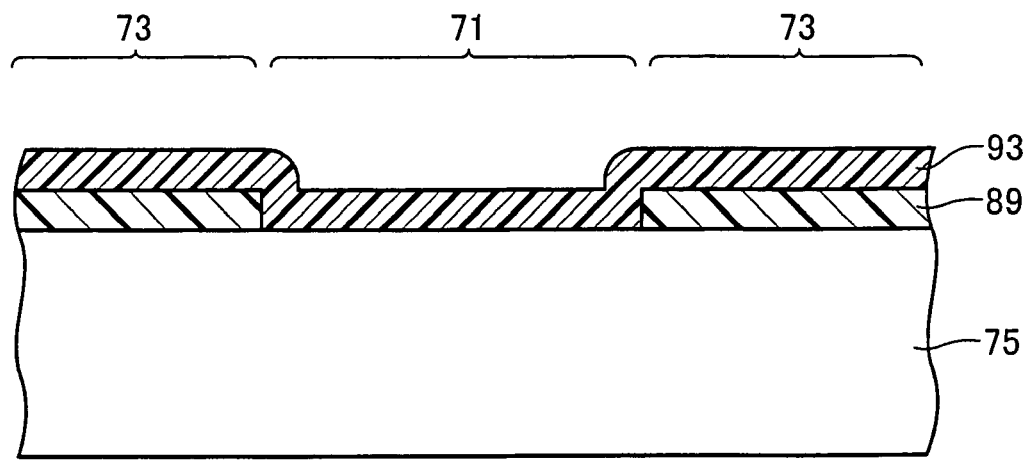
FIG. 37 is a partial sectional view showing a first step in the fabrication method of a semiconductor device in accordance with a third embodiment.

As shown in FIG. 37, an etching resistant material film 89, for example, CVD silicon nitride film, is formed on the whole surface of a semiconductor body 75, and a part thereof on a first area 71, on which a certain pattern is to be formed, is removed with a resist pattern as a mask. After having removed the resist, a patterning object film 93, for example, CVD silicon oxide, is formed to cover the exposed first area 71 and the etching resistant material film 89 on the semiconductor body 75.

Figure 38:
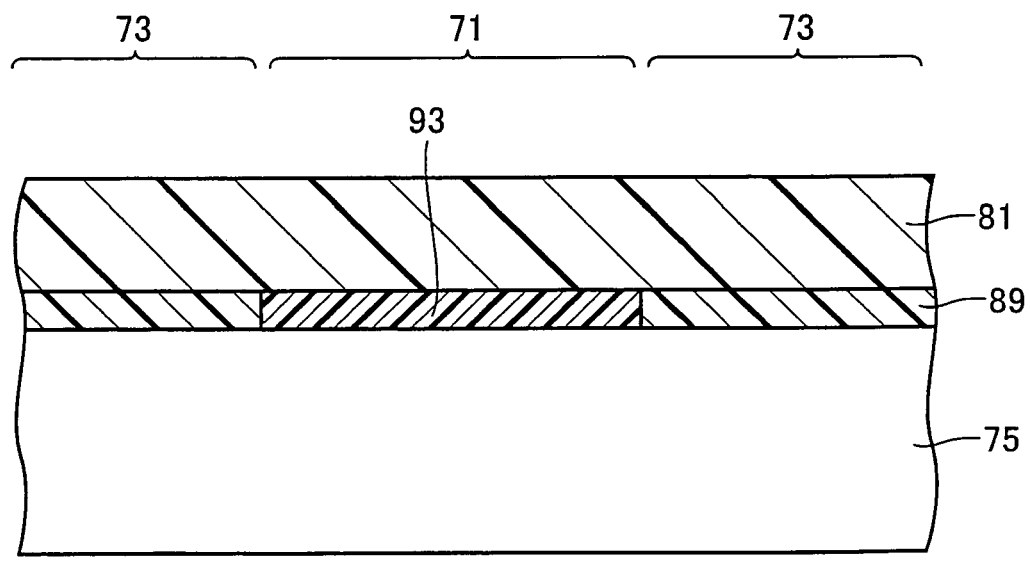
FIG. 38 is a partial sectional view showing a second step thereof.
Figure 39:
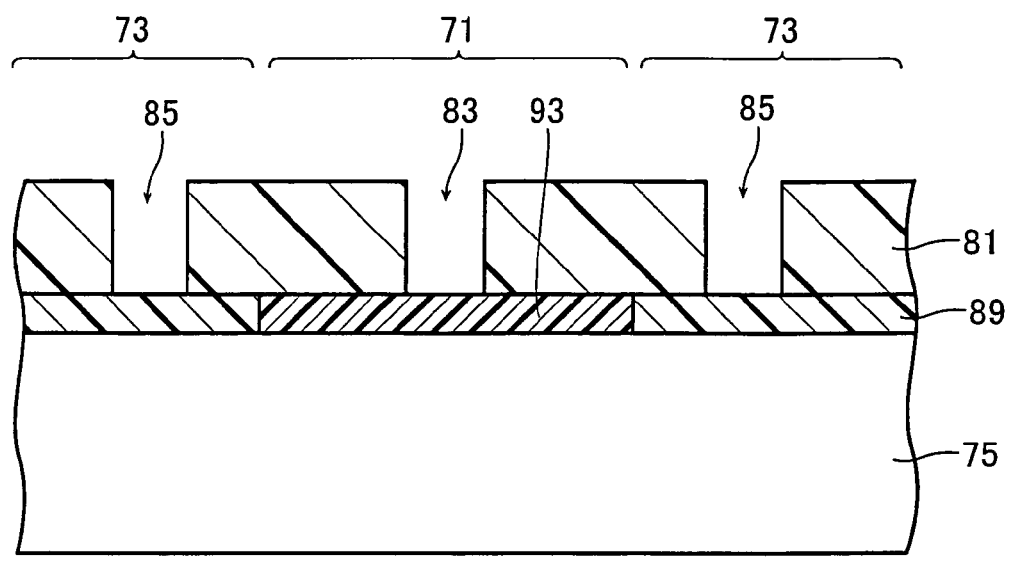
FIG. 39 is a partial sectional view showing a third step thereof.
Figure 40:
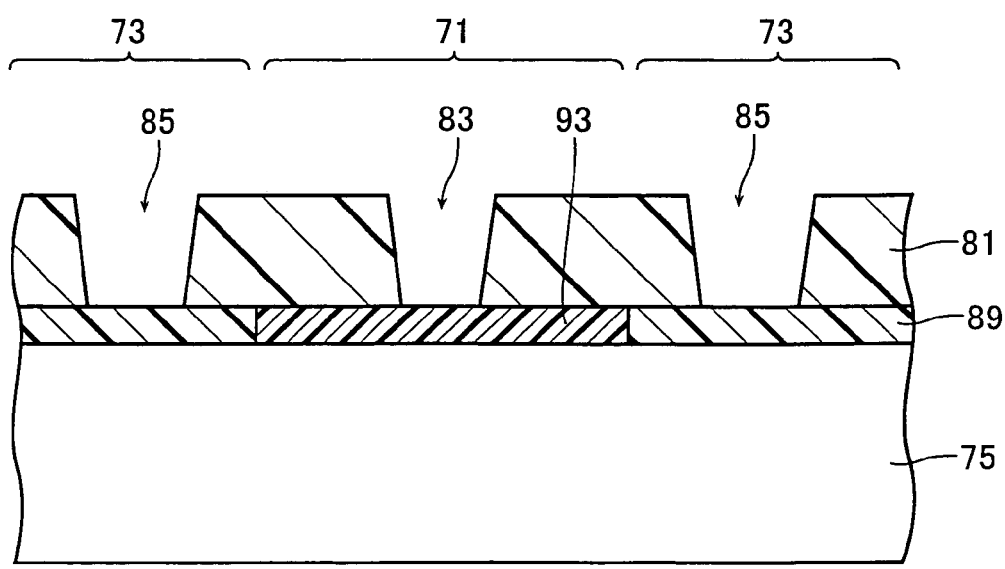
FIG. 40 is a partial sectional view showing a fourth step thereof.
Figure 41:
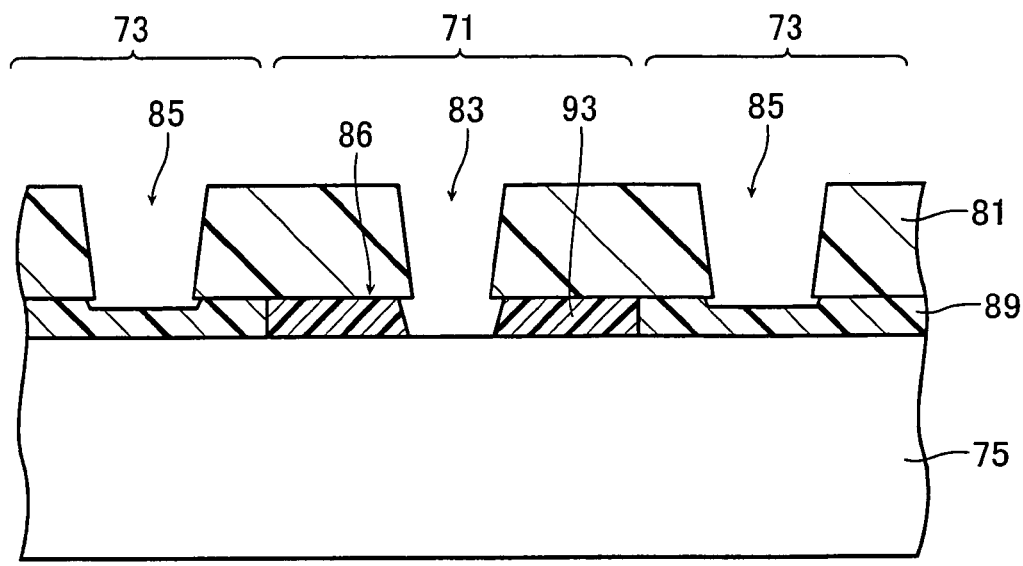
FIG. 41 is a partial sectional view showing a fifth step thereof.
Figure 42:
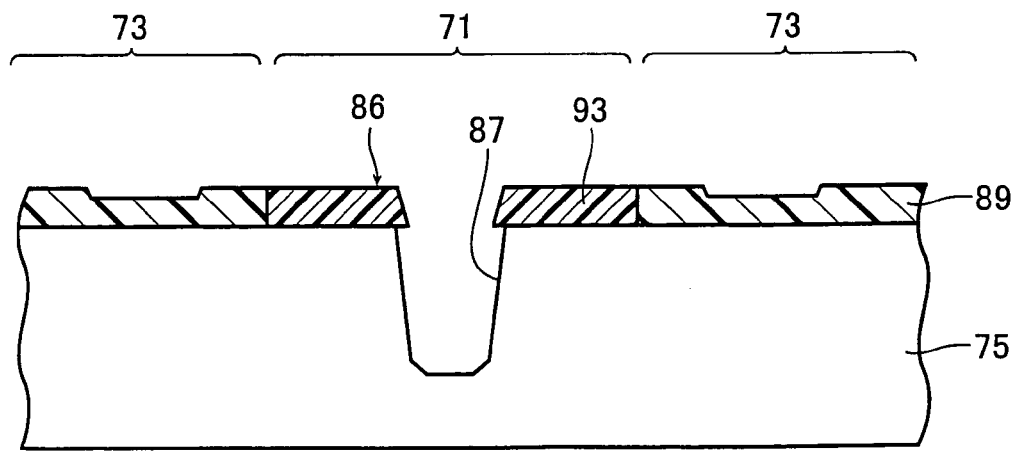
FIG. 42 is a partial sectional view showing a sixth step thereof.

Then, the patterning object film 93 is subjected to a CMP process with the etching resistant material film 89 as an etching stopper. As a result, as shown in FIG. 38, it is obtained such a state where the first area 71 is covered with the patterning object film 93; and the second area 73 with the etching resistant material film 89. At this time, the patterning object film 93 becomes to have the same or substantially the same thickness as the etching resistant material film 89. Then, a resist film 81 is formed to cover the ever the patterning object film 93 and the etching resistant material film 89. Note that the formation order of the patterning object film 93 and the etching resistant material film 89 is not limited to the above-described example.

The successive steps are the same as in the second embodiment. That is, FIGS. 39, 40, 41 and 42 correspond to FIGS. 30, 31, 32 and 33, respectively. According to this third embodiment, the size controllability of the trench 87 may be improved as well as in the second embodiment because the dummy resist pattern 85 is formed. Since the etching resistant material film 89 is formed on the second area 73 in the third embodiment, it is possible to prevent the body 75 from being etched to form a trench here.

This embodiment may be adapted to not only a case where a certain pattern is formed in the semiconductor body itself or in a layer formed on the body but also another case where the certain pattern is formed in another layer formed above the body with other layer(s) interposed therebetween.

Fourth Embodiment

In a fourth embodiment, the method of forming the certain pattern 86 (FIGS. 32 and 41) in the second and third embodiments is adapted to patterning of the interlayer insulating film 35 (FIG. 1) in the first embodiment.

Figure 43:
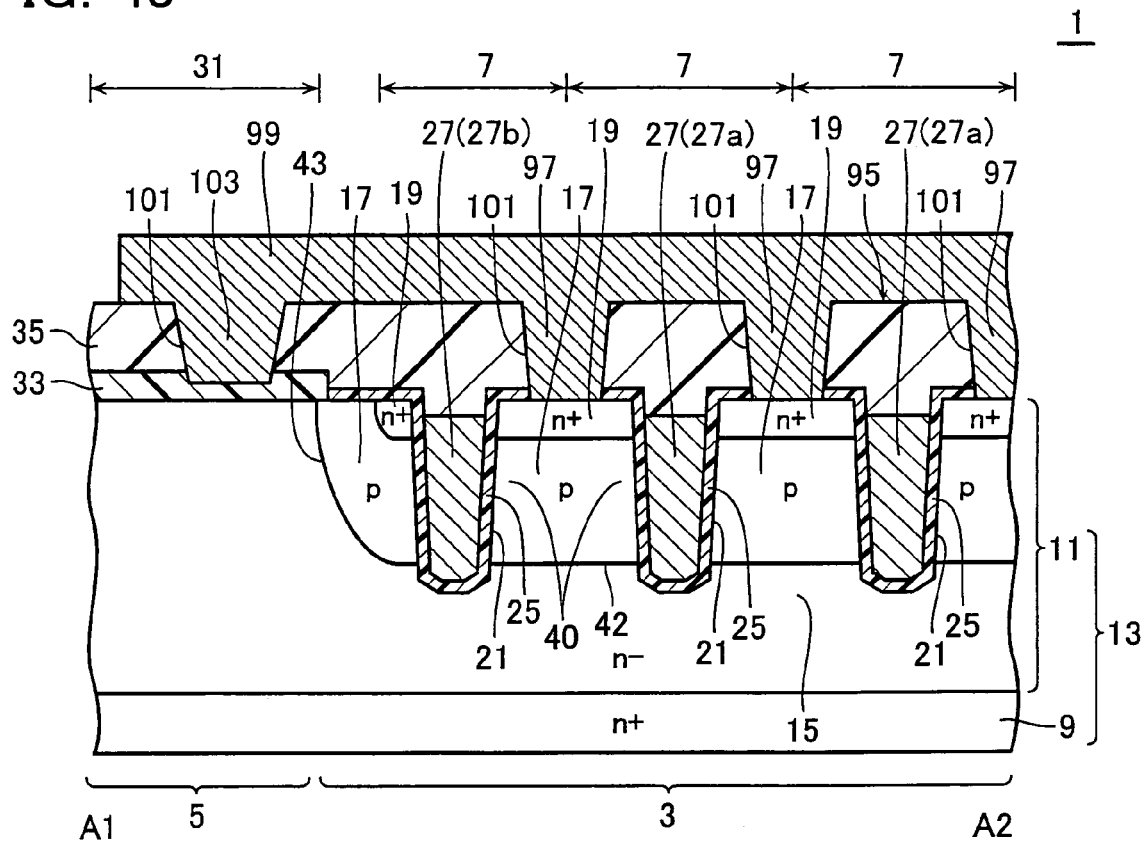
FIG. 43 is a partial sectional view sowing the boundary between the cell area and the termination area of a semiconductor device in accordance with a fourth embodiment.
Figure 44:
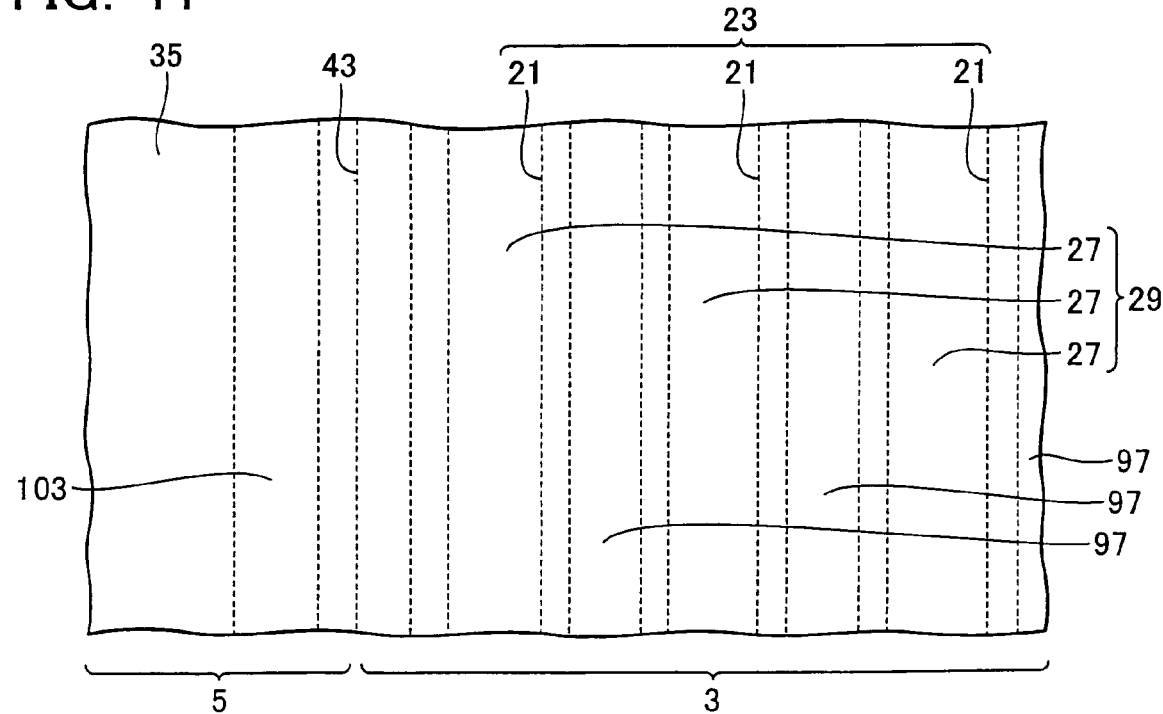
FIG. 44 is a partial plan view thereof.

FIG. 43 is a partial sectional view showing a boundary portion between a cell area 3 and a termination area 5 surrounding it in a semiconductor device 1 in accordance with this embodiment, which corresponds to FIG. 1. FIG. 44 is a partial plan view of the semiconductor device 1 shown in FIG. 43, and corresponds to FIG. 2.

The interlayer insulating film 35 is patterned to have a certain pattern 95 in this embodiment. Explaining in detail, in the interlayer insulating film 35, hole 101 is formed to reach the source region 19 as corresponding to a source contact portion 97 on the source region 19. On the interlayer insulating film 35, in which hole 101 is formed, source electrode 99 is formed of, for example, an aluminum film. The source contact portion 97 is stripe-shaped on a plan view and extended in the same direction as the trench gate pattern 29. The source contact portion 97 is positioned on the base region 17 in a sectional view (not shown), and the source electrode 99 is electrically connected to the base region 19 at the position.

In the interlayer insulating film 35 above the termination area 5, hole 101 is formed to reach the insulating film 33, in which conductive film 103 is buried. This structure is formed through the patterning process of the interlayer insulating film 35 and the formation process of the source electrode 99.

The cell area 3 is an example of the first area, on which a certain pattern is to be formed, and the termination area 5 is an example of the second area adjacent to the first area. The insulating film 33 is an example of the underlying material film. The interlayer insulating film 35 is an example of the patterning object film. Use whichever of the second and third embodiments, and the interlayer insulating film 35 may be patterned. It will be explained here such a case where the method of the second embodiment is adapted to the fourth embodiment. With reference to FIGS. 43 to 52, the detail will be explained. A1-A2 sectional views in FIGS. 45 to 52 correspond to FIG. 43; and the others to FIG. 44.

Figure 45:
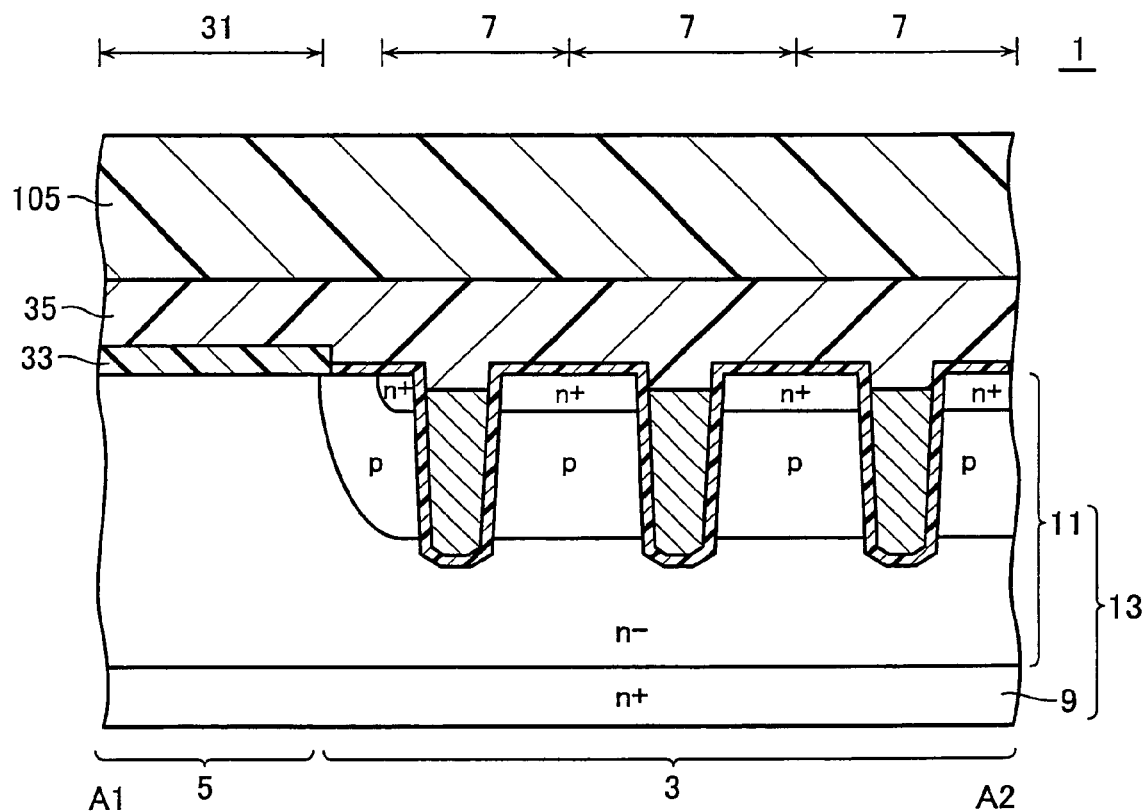
FIG. 45 is a partial sectional view showing a first step in the fabrication method of the semiconductor device in accordance with the fourth embodiment.
Figure 46:
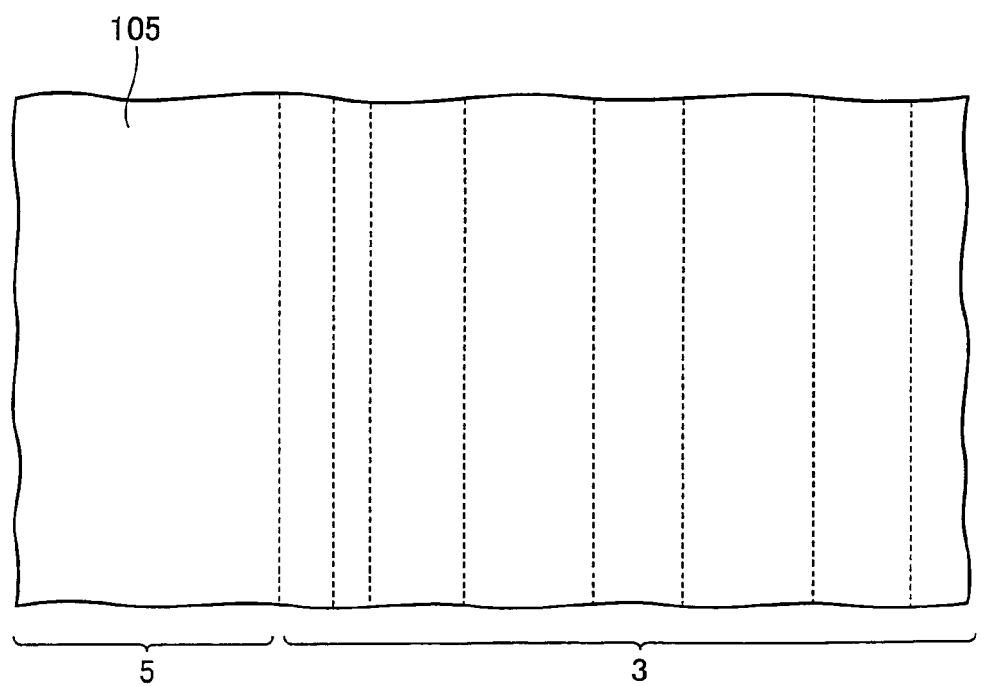
FIG. 46 is a partial plan view thereof.
Figure 47:
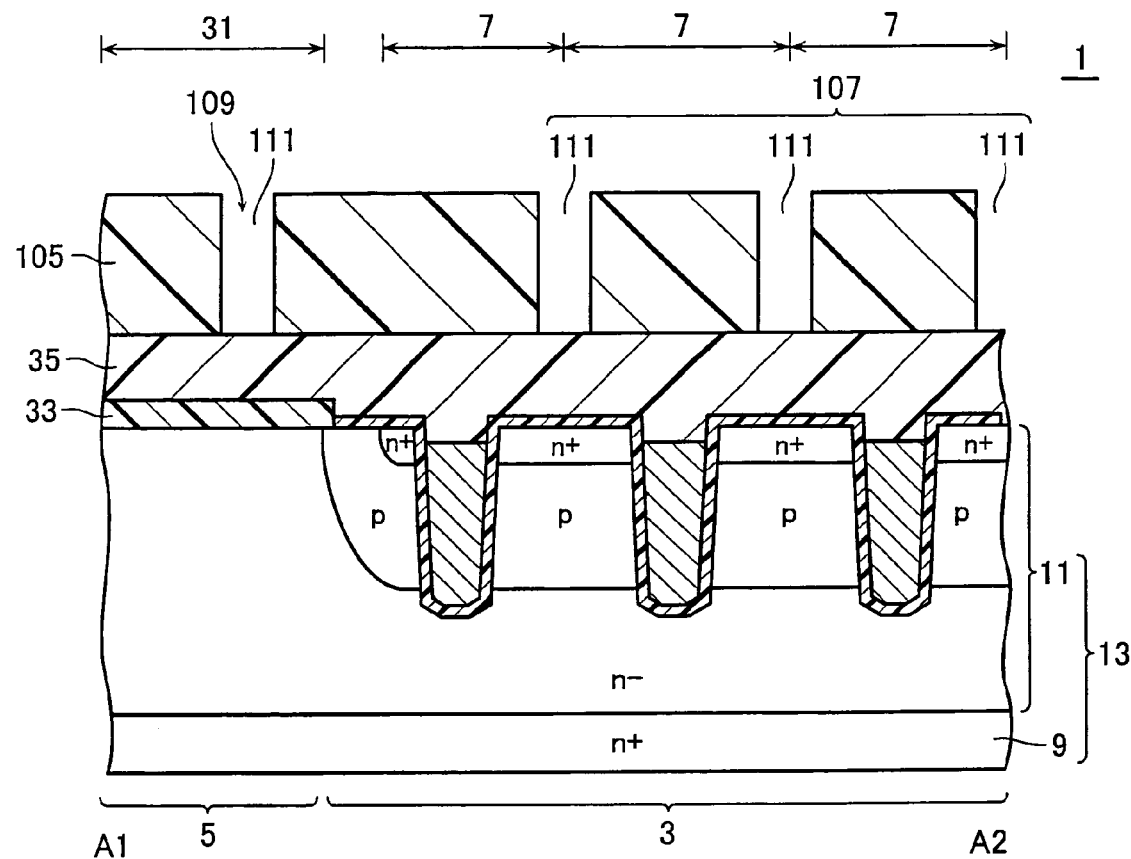
FIG. 47 is a partial sectional view showing a second step in the fabrication method of the semiconductor device in accordance with the fourth embodiment.
Figure 48:
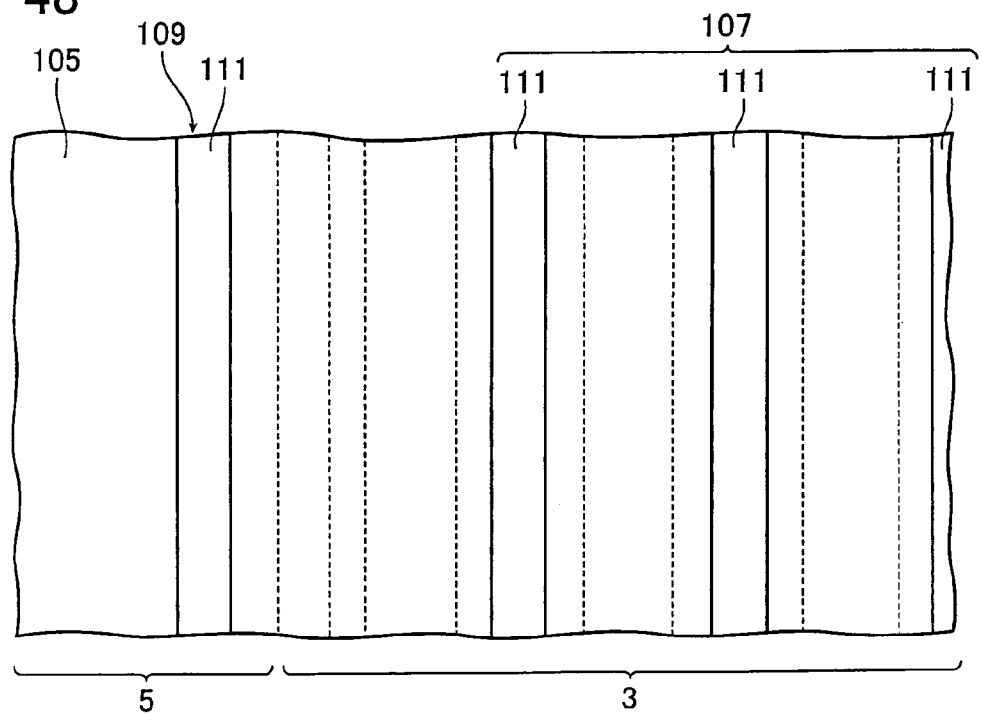
FIG. 48 is a partial plan view thereof.

As shown in FIGS. 45 and 46, the interlayer insulating film 35 is covered with a resist film 105. Following it, as shown in FIGS. 47 and 48, the resist film 105 is patterned. Explaining in detail, resist-removed patterns (i.e., openings) 111 above the cell area 3 serve as a certain resist pattern 107 corresponding to the certain pattern; and an opening 111 above the termination area 5 as a dummy resist pattern 109. As similar to that the dummy resist pattern 55 surrounds the gate-use resist pattern 53 as shown in FIG. 22, the dummy resist pattern 109 surrounds the stripe-shaped certain resist pattern 107.

Figure 49:
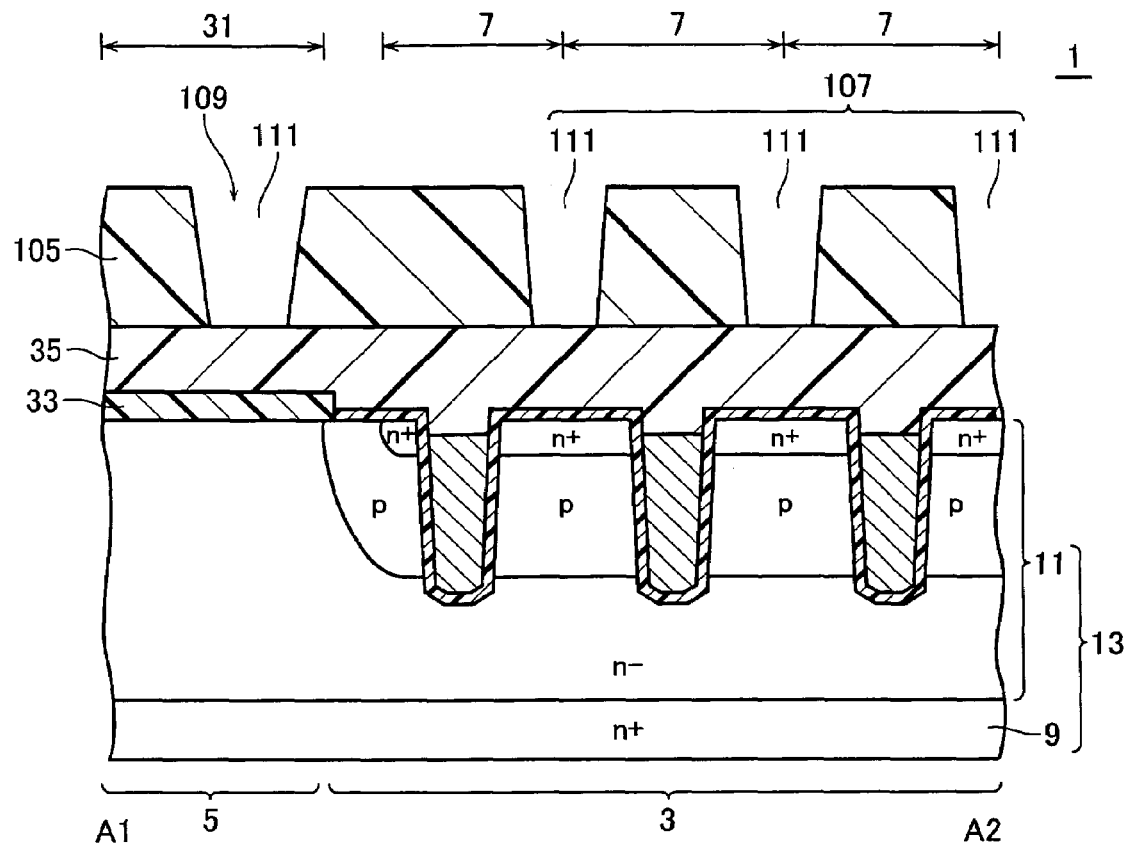
FIG. 49 is a partial sectional view showing a third step in the fabrication method of the semiconductor device in accordance with the fourth embodiment.
Figure 50:
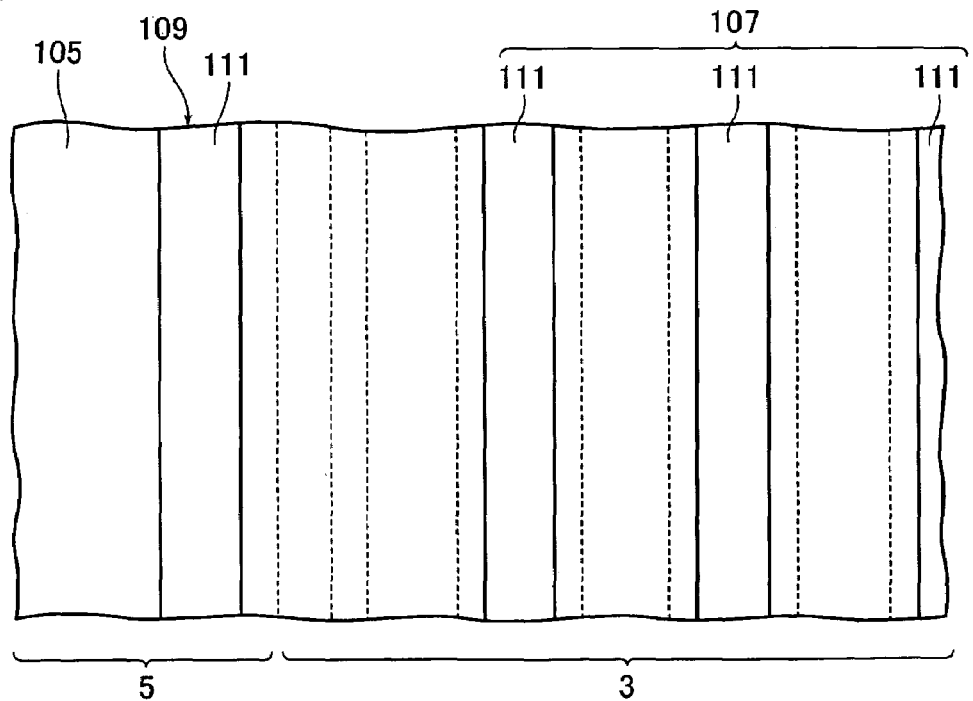
FIG. 50 is a partial plan view thereof.
Figure 51:
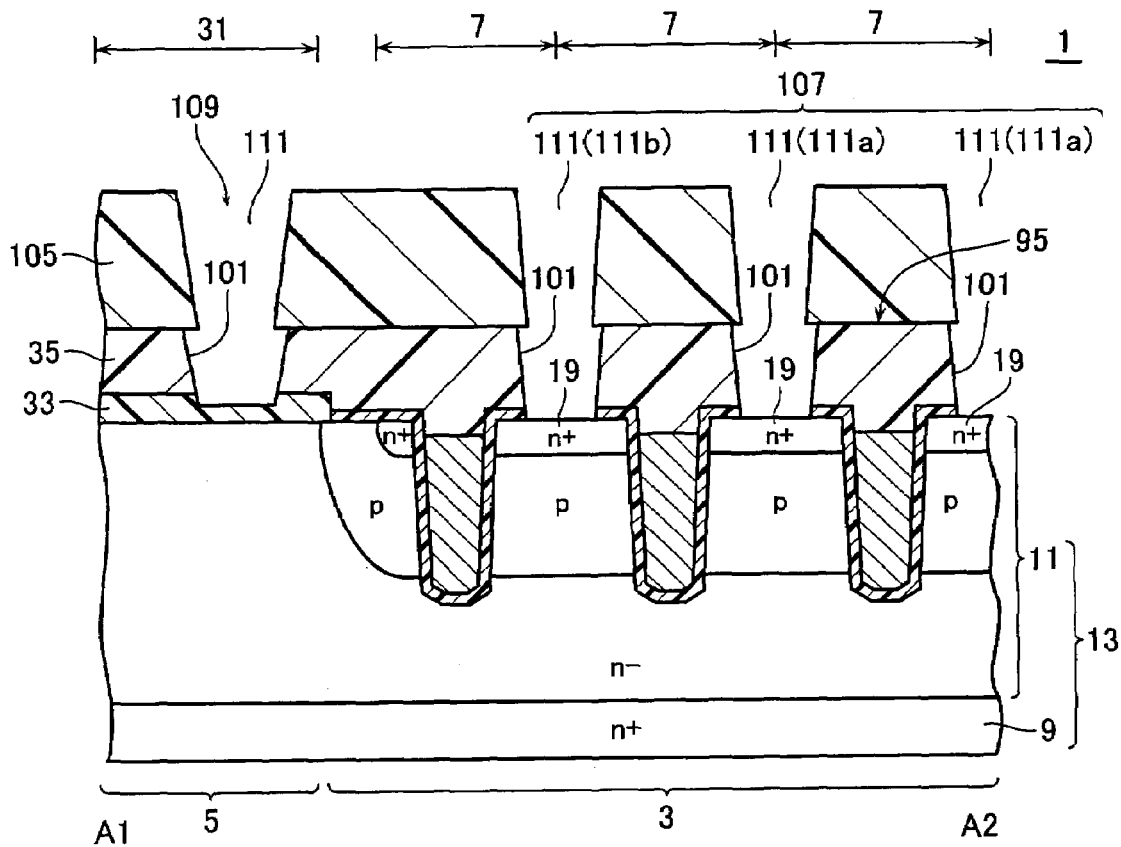
FIG. 51 is a partial sectional view showing a fourth step in the fabrication method of the semiconductor device in accordance with the fourth embodiment.
Figure 52:
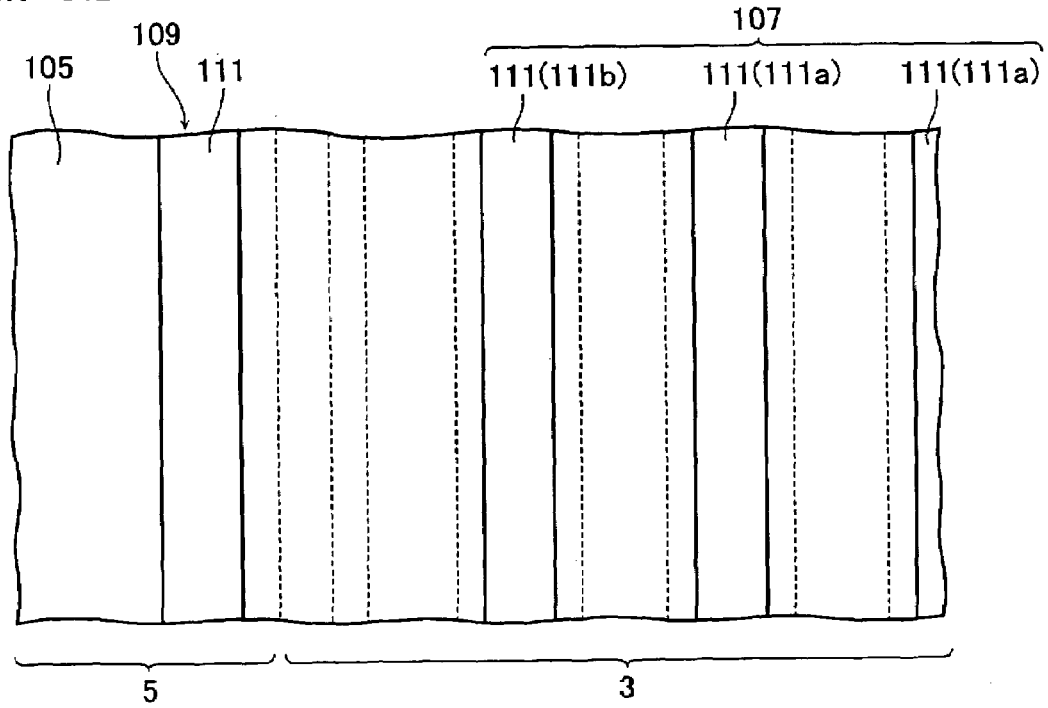
FIG. 52 is a partial plan view thereof.

As shown in FIGS. 49 and 50, the resist film 105 is baked and hardened. This is the same as the process in FIG. 31. Next, as shown in FIGS. 51 and 52, the interlayer insulating film 35 is selectively etched with the patterned resist film 105 as a mask so that hole 101 is formed to expose the source region 19 at the source contact portion. That is, the interlayer insulating film 35 is selectively etched to form the certain pattern 95. This corresponds to the step shown in FIG. 32.

Note here that since there is dummy resist pattern 109 above the termination area 5, it is not avoided to form hole 101 in the interlayer insulating film 35 there. However, the bottom of the hole 101 is positioned in the insulating film 33, and it does not reach the semiconductor body 13 because there is insulating film 33 as the underlying material film.

As shown in FIGS. 43 and 44, after having removed the resist 105, an aluminum film is formed by sputtering on the whole surface of the device. This aluminum film is patterned, and the source electrode 19 is formed. In the hole 101 exposing the source region 19 on the cell area 3, aluminum as a metal material is buried to be source contact portion 97; and in the hole 101 formed above the termination area 5, conductive film of aluminum is buried.

The main effects of the fourth embodiment will be explained below. As shown in FIGS. 43 and 44, the source contact portion 97 is patterned to be stripe-shaped as similar to the trench gate pattern 29. Therefore, if the dummy resist pattern 109 (FIGS. 47 and 48) is not disposed, the most outside one in the holes 101 to be buried with source contact portions 97 will be expanded in width due to the above-described twitching phenomenon. Therefore, the distance between the trench 21 and the source contact portion 97 becomes less, and there is generated such a possibility that the source electrode 99 and the gate 27 are short-circuited at the most outside source contact portion 97 (gate defect).

As shown in FIG. 51, in the fourth embodiment, the influence of the twitching phenomenon on the opening 111b corresponding to the most outside source contact portion 97 may be reduced because the dummy resist pattern 109 is disposed. Therefore, it is possible to form a source contact portion 97 in the interlayer insulating film 35 under this opening 111b with a desirable size as similar to those at the remaining openings 111a, thereby preventing the source electrode 99 and the gate 27 from being short-circuited, as shown in FIG. 43.

This invention is not limited to the above-described embodiment. It will be understood by those skilled in the art that various changes in form and detail may be made without departing from the spirit, scope, and teaching of the invention.

What is claimed is:

1. A method of fabricating a semiconductor device with a semiconductor body and a trench gate formed in a cell area thereof, comprising:

forming an insulating film on the semiconductor body to cover a termination area surrounding the cell area;

forming a mask material film to cover the cell area and the insulating film;

forming a resist film to cover the mask material film;

patterning the resist film to have an opening serving as a gate-use resist pattern above the cell area and another opening serving as a dummy resist pattern above the insulating film;

selectively etching the mask material film by use of the patterned resist film as a mask so that the insulating film is remained under the dummy resist pattern;

selectively etching the semiconductor body by use of the patterned mask material film as another mask to form a trench in the cell area as corresponding to the gate-use resist pattern; and burying gate material in the trench to form the trench gate.

2. The method according to claim 1, wherein
the gate-use resist pattern is formed to have a stripe-shaped resist pattern and a frame-shaped resist pattern surrounding it.

3. The method according to claim 2, wherein
the dummy resist pattern is formed to surround the frame-shaped resist pattern.

4. The method according to claim 2, wherein
the gate-use resist pattern is formed to have a plurality of stripe-shaped resist patterns, and
the dummy resist pattern is formed apart from the frame-shaped resist pattern with a distance substantially equal to each gap in the stripe-shaped resist patterns and a gap between the frame-shaped resist pattern and the stripe-shaped resist pattern disposed adjacent thereto.

5. The method according to claim 1, wherein
the insulating film serves as a field insulating film, and the mask material film is formed of a CVD silicon oxide film.

6. The method according to claim 1, wherein
the semiconductor device is a transistor,
the semiconductor body comprises a semiconductor substrate serving as a first main electrode region; an epitaxial layer of a first conductivity type formed thereon; and a base region of a second conductivity type formed on the epitaxial layer, and
the trench gate is formed to extend into the semiconductor body from the surface of the semiconductor body so as to reach the bottom of the base region, a second main electrode region of the first conductivity type being formed on the surface of the base region.

* * * * *